US012666576B2

(12) United States Patent
Rivaud et al.

(10) Patent No.: US 12,666,576 B2
(45) Date of Patent: Jun. 23, 2026

(54) ANGLED AND STEPPED FACEPLATE FOR TELECOMMUNICATIONS AND NETWORKING SHELF AND CIRCUIT PACKS

(71) Applicant: Ciena Corporation, Hanover, MD (US)

(72) Inventors: Daniel Rivaud, Ottawa (CA); Spencer Giacalone, Ottawa (CA); Fabien Colton, Kars (CA); Simon Shearman, Carleton Place (CA); Peter Ajersch, Ottawa (CA); Behazad Mohajer, Ottawa (CA)

(73) Assignee: Ciena Corporation, Hanover, MD (US)

( * ) Notice: Subject to any disclaimer, the term of this patent is extended or adjusted under 35 U.S.C. 154(b) by 212 days.

(21) Appl. No.: 18/230,806

(22) Filed: Aug. 7, 2023

(65) Prior Publication Data

US 2024/0179877 A1    May 30, 2024

Related U.S. Application Data

(63) Continuation-in-part of application No. 17/994,574, filed on Nov. 28, 2022, now Pat. No. 11,985,454.

(51) Int. Cl.
H05K 7/20        (2006.01)

(52) U.S. Cl.
CPC ..... *H05K 7/20809* (2013.01); *H05K 7/20309* (2013.01); *H05K 7/20318* (2013.01); *H05K 7/20336* (2013.01); *H05K 7/2039* (2013.01)

(58) Field of Classification Search
CPC ........ G02B 6/3897; G02B 6/428; G02B 6/43; G02B 6/4278; G02B 6/44526; G02B 6/354; H05K 7/023; H05K 7/186; H05K 2201/10121; G06F 1/181; H04Q 2213/13523; H04Q 3/0066
USPC ......................................................... 361/600
See application file for complete search history.

(56) References Cited

U.S. PATENT DOCUMENTS

| | | | | | |
|---|---|---|---|---|---|
| 8,894,438 | B2 * | 11/2014 | Schmitt | ............... | H01R 13/659 |
| | | | | | 439/540.1 |
| 9,794,195 | B1 * | 10/2017 | Wilson | .................... | H04L 49/40 |
| 2009/0023309 | A1 * | 1/2009 | Knapp | ................. | H05K 1/0295 |
| | | | | | 361/784 |
| 2011/0086521 | A1 * | 4/2011 | Miki | .................. | H01R 13/6471 |
| | | | | | 439/660 |
| 2011/0217009 | A1 * | 9/2011 | Burrell | ..................... | G02B 6/36 |
| | | | | | 385/92 |

(Continued)

FOREIGN PATENT DOCUMENTS

| | | | | | |
|---|---|---|---|---|---|
| JP | 2014030049 A | * | 2/2014 | ............. | H01L 24/97 |

*Primary Examiner* — Mandeep S Buttar
(74) *Attorney, Agent, or Firm* — Clements Bernard Walker; Christopher L. Bernard

(57) ABSTRACT

A shelf system for use in a telecommunications or networking application, the shelf system including a shelf assembly and a circuit pack conformally inserted into the shelf assembly. The circuit pack includes a printed circuit board disposed in an enclosure, an integrated circuit chip coupled to the printed circuit board, and a plurality of ports coupled to the printed circuit board and disposed around the integrated circuit chip. The ports of the plurality of ports are angled relative to a front faceplate of the enclosure such that lengths of tracks between the ports and the integrated circuit chip are less than a predetermined maximum length.

17 Claims, 25 Drawing Sheets

(56)     References Cited

U.S. PATENT DOCUMENTS

| | | | |
|---|---|---|---|
| 2013/0163209 A1* | 6/2013 | Blakemore | H05K 3/301 |
| | | | 29/842 |
| 2014/0240918 A1* | 8/2014 | Damaraju | H01L 23/427 |
| | | | 165/104.21 |
| 2016/0183402 A1* | 6/2016 | Tamarkin | H05K 1/117 |
| | | | 361/679.4 |
| 2019/0109800 A1* | 4/2019 | Yao | H04L 49/15 |
| 2022/0115844 A1* | 4/2022 | Shearman | H05K 7/02 |
| 2025/0056709 A1* | 2/2025 | Rivaud | H05K 1/0213 |
| 2025/0063679 A1* | 2/2025 | Shearman | H05K 7/1428 |
| 2025/0133691 A1* | 4/2025 | Shearman | H05K 7/20272 |
| 2025/0176120 A1* | 5/2025 | Colton | H05K 5/0226 |

* cited by examiner

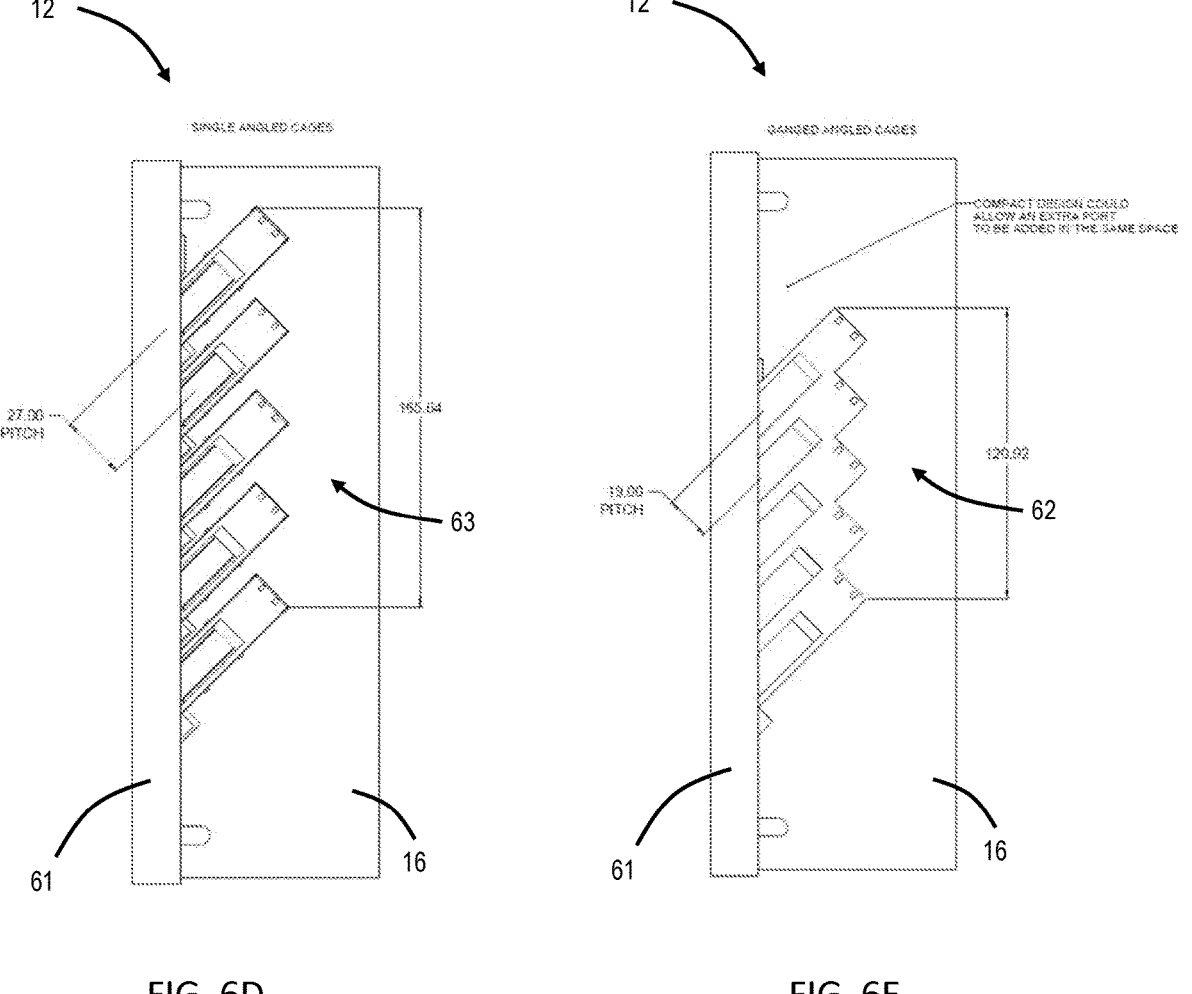
FIG. 6D                 FIG. 6E

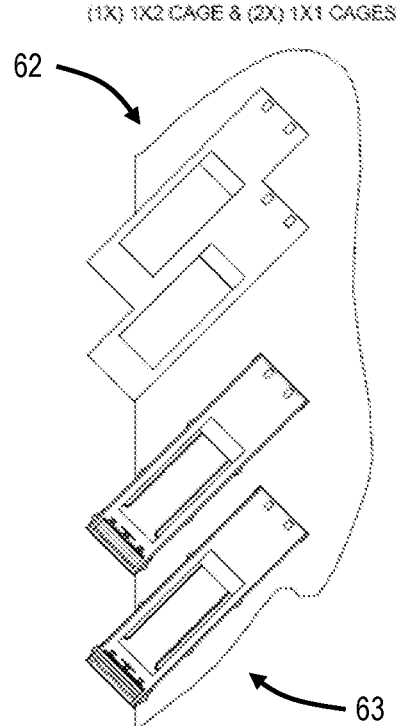
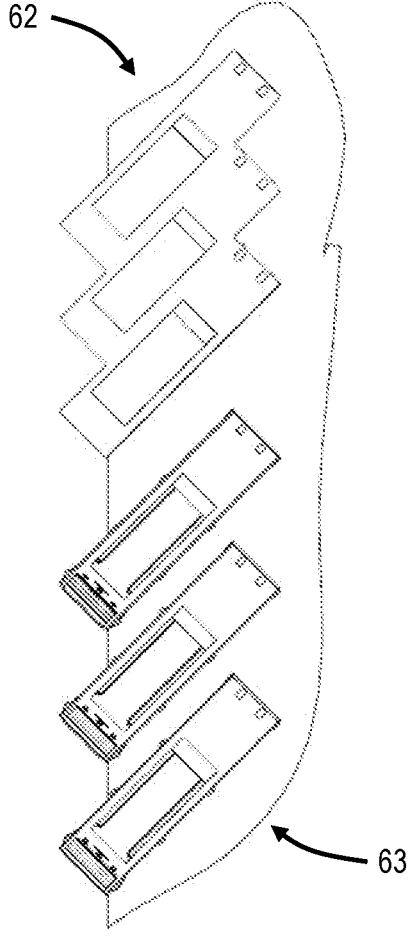
FIG. 6F                    FIG. 6G

ANGLED AND STEPPED FACEPLATE FOR TELECOMMUNICATIONS AND NETWORKING SHELF AND CIRCUIT PACKS

CROSS-REFERENCE TO RELATED APPLICATION

The present disclosure claims the benefit of priority of co-pending U.S. patent application Ser. No. 17/994,574, filed on Nov. 28, 2022, and entitled "ANGLED FACE-PLATES FOR A NETWORK ELEMENT," the contents of which are incorporated in full by reference herein.

TECHNICAL FIELD

The present disclosure relates generally to the telecommunications and networking fields. More particularly, the present disclosure relates to telecommunications and networking shelf and circuit packs utilizing an angled and stepped arrangement of ports around an integrated circuit chip for reduced signal track length, lower power consumption, and improved cooling efficiency.

BACKGROUND

In an optical switching system with cable-based fabric, it is desirable to reduce signal track length between client ports and fabric ports and an integrated circuit chip such as an application specific integrated circuit (ASIC) chip in order to reduce power consumption. Such ports include quad small form factor pluggable-double density (QSFP-DD) ports and octal small form factor pluggable (OSFP) ports, for example.

Conventionally, most shelf and circuit packs utilize generally forward-facing higher power client ports and generally forward-facing lower power fabric ports. An ASIC is disposed behind all these ports. In descriptions herein, the terms integrated circuit chip, ASIC chip, and ASIC may be used interchangeably depending on the context. This arrangement allows full frontal inlet airflow to pass over all optical and electrical ports to cooling fans located at the rear of the shelf and circuit packs, for example. Client ports may be spaced apart to accommodate larger heatsinks for the higher power devices. Fabric ports may be in ganged ports as they have lower power consumption and do not require larger heatsinks. Datacenter customers may use lower power client ports because they may be shorter reach (e.g., 2 km), and may demand lower power consumption from optical ports.

The present background is provided as illustrative environmental context only and should not be construed to be limiting in any manner. It will be readily apparent to those of ordinary skill in the art that the principles and concepts of the present disclosure may be implanted in other environmental contexts equally.

SUMMARY

The present disclosure relates to telecommunications and networking shelf and circuit packs utilizing an angled and stepped arrangement of ports around an integrated circuit chip. In one illustrative embodiment, the present disclosure provides a circuit pack adapted to be inserted into a conformal shelf assembly. The circuit pack includes a printed circuit board disposed in an enclosure, an integrated circuit chip coupled to the printed circuit board, and a plurality of ports coupled to the printed circuit board and disposed around the integrated circuit chip. Ports of the plurality of ports are angled relative to a front faceplate of the enclosure such that lengths of tracks between the ports and the integrated circuit chip are less than a predetermined maximum length. Optionally, each of the ports of the plurality of ports may include a pluggable optical module.

In some embodiments, at least some of the ports are stepped relative to each other. Also, ports of the plurality of ports are accessible from the faceplate and side facing corners of the enclosure. Ports of the plurality of ports include one or more of client ports and fabric ports. The integrated circuit chip is disposed in a central portion of the printed circuit board and between a plurality of fabric ports and a plurality of client ports of the plurality of ports, for example. A conformal busbar is coupled to the printed circuit board and disposed around at least a portion of a perimeter of the integrated circuit chip.

A heat sink may be disposed within the enclosure adjacent to a component side of the printed circuit board. The heat sink may be configured as a vapor chamber suitable to circulate a fluid such that heat is removed from one or more heat sources of the printed circuit board. The vapor chamber may include an evaporator proximate to the one or more heat sources of the printed circuit board and configured to thermally transfer heat from the one or more heat sources of the printed circuit board to the fluid of the vapor chamber. The vapor chamber may further include a condenser physically displaced from the one or more heat sources of the printed circuit board and fluidly coupled to the evaporator. The condenser may be configured to thermally transfer heat from the fluid of the vapor chamber. The vapor chamber may also include a wick structure fluidly coupled between the condenser and the evaporator such that the fluid is transferred from the condenser to the evaporator and completing a fluid circuit of the vapor chamber.

In another illustrative embodiment, the present disclosure provides a shelf assembly adapted to receive an inserted conformal circuit pack. The shelf assembly includes a chassis defining an opening adapted to provide access to a plurality of ports of the circuit pack, where the circuit pack is adapted to be inserted into the shelf assembly. The circuit pack is adapted to be inserted into the shelf assembly. The circuit pack includes a printed circuit board disposed in an enclosure, an integrated circuit chip coupled to the printed circuit board, and the plurality of ports coupled to the printed circuit board and disposed around the integrated circuit chip. Ports of the plurality of ports are angled relative to a front faceplate of the enclosure such that lengths of tracks between the ports and the integrated circuit chip are less than a predetermined maximum length. Optionally, each of the ports of the plurality of ports may include a pluggable optical module.

In some embodiments, at least some of the ports are stepped relative to each other. Also, ports of the plurality of ports are accessible from the faceplate and side facing corners of the enclosure. Ports of the plurality of ports include one or more of client ports and fabric ports. The integrated circuit chip is disposed in a central portion of the printed circuit board and between a plurality of fabric ports and a plurality of client ports of the plurality of ports. A conformal busbar is coupled to the printed circuit board and disposed around at least a portion of a perimeter of the integrated circuit chip.

A heat sink may be disposed within the enclosure adjacent to a component side of the printed circuit board. The heat sink may be configured as a vapor chamber suitable to circulate a fluid such that heat is removed from one or more heat sources of the printed circuit board. The vapor chamber may include an evaporator proximate to the one or more heat sources of the printed circuit board and configured to thermally transfer heat from the one or more heat sources of the printed circuit board to the fluid of the vapor chamber. The vapor chamber may further include a condenser physically displaced from the one or more heat sources of the printed circuit board and fluidly coupled to the evaporator. The condenser may be configured to thermally transfer heat from the fluid of the vapor chamber. The vapor chamber may also include a wick structure fluidly coupled between the condenser and the evaporator such that the fluid is transferred from the condenser to the evaporator and completing a fluid circuit of the vapor chamber.

In a further illustrative embodiment, the present disclosure provides a shelf system for use in a telecommunications or networking application. The shelf system includes a shelf assembly and a circuit pack conformally inserted into the shelf assembly. The circuit pack includes a printed circuit board disposed in an enclosure, an integrated circuit chip coupled to the printed circuit board, and a plurality of ports coupled to the printed circuit board and disposed around the integrated circuit chip, ports of the plurality of ports are angled relative to a front faceplate of the enclosure such that lengths of tracks between the ports and the integrated circuit chip are less than a predetermined maximum length. Optionally, at least some of the ports are stepped relative to each other. Also, ports of the plurality of ports are accessible from the faceplate and side facing corners of the enclosure. Ports of the plurality of ports include one or more of client ports and fabric ports. The integrated circuit chip is disposed in a central portion of the printed circuit board and between a plurality of fabric ports and a plurality of client ports of the plurality of ports. A conformal busbar is coupled to the printed circuit board and disposed around at least a portion of a perimeter of the integrated circuit chip.

BRIEF DESCRIPTION OF THE DRAWINGS

The present disclosure is illustrated and described with reference to the various drawings, in which like reference numbers are used to denote like assembly and/or system components and/or method steps, as appropriate.

FIG. 6D illustrates a top view of the embodiment of the circuit pack of the present disclosure with individual ports.

FIG. 6E illustrates a top view of the embodiment of the circuit pack of the present disclosure with ganged ports.

FIG. 6F illustrates a top view of an embodiment of ports of the present disclosure with individual ports and ganged ports.

FIG. 6G illustrates a top view of another embodiment of ports of the present disclosure with individual ports and ganged ports.

Figure 1:
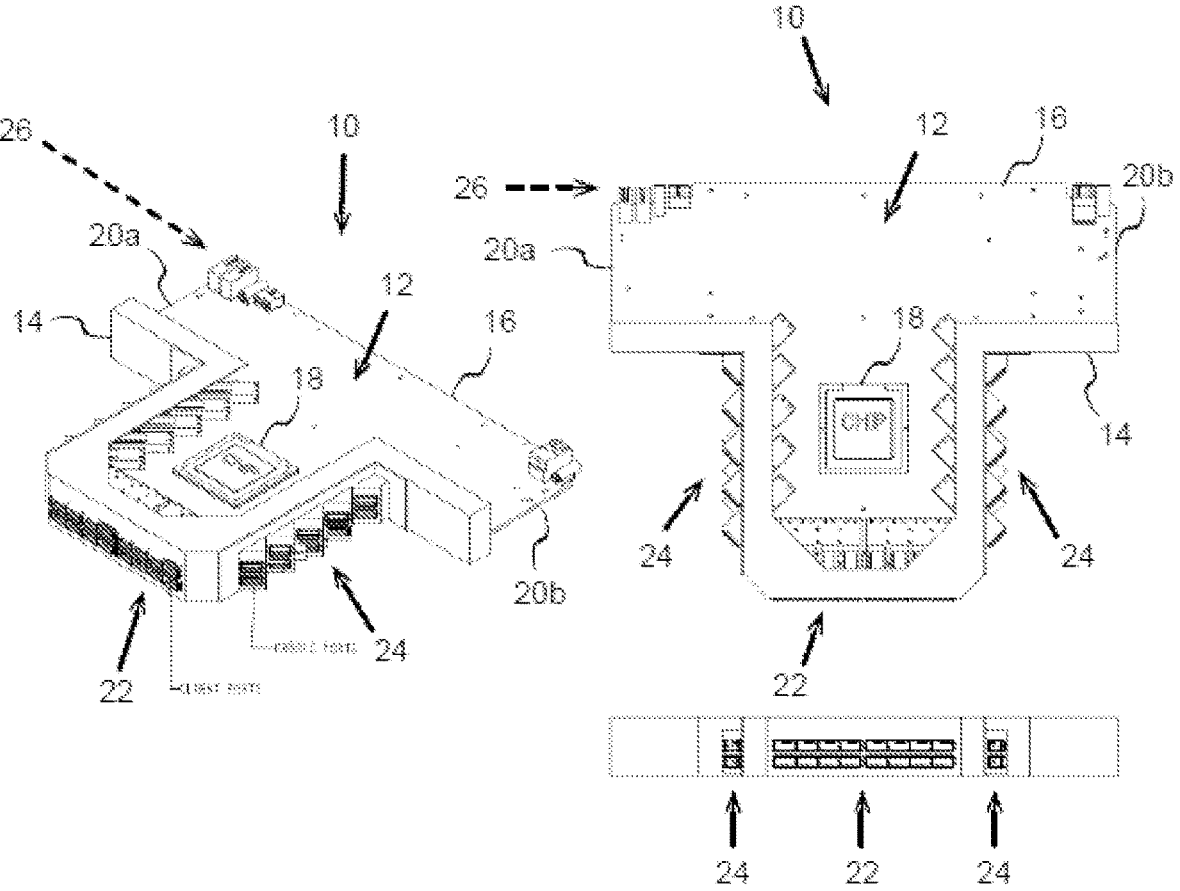
FIG. 1 illustrates a perspective view, a top view, and a front view of one embodiment of a circuit card assembly and circuit pack a client box of the present disclosure.

It will be readily apparent to those of ordinary skill in the art that aspects and features of each of the illustrated embodiments may be incorporated, omitted, and/or combined as desired in a given application, without limitation.

DETAILED DESCRIPTION

The present disclosure relates to telecommunications and networking shelf and circuit packs utilizing an angled and stepped arrangement of ports around an integrated circuit chip. As indicated herein, the present disclosure is based on the concept that it is possible to reduce power consumption by arranging client ports closer to the designated client connections of an integrated circuit such as an ASIC and fabric ports closer to the designated fabric connections of the ASIC. It is desirable to position the ports (e.g., pluggable optical modules (POM) and/or QSFP-DD/OSFP connectors) within a short distance (e.g., within about 3 inches) of these ASIC connections. Thus, the ports are positioned at angles and stepped on the front corners, and optionally along the front face, of a circuit pack. These ports may be client ports and/or fabric ports. The side faces of the circuit pack may be reserved for mounting guidance.

Embodiments described herein address a variety of challenges. For example, hyperscalers are facing a challenge, which is that optics modules, including serializer/deserializers (SerDes) consume a significant amount of available datacenter power. Embodiments of the present disclosure address this challenge.

The industry has identified various solutions to challenges associated with co-packaged optics (CPOs), vertical line cards (VLCs), and linear drive optics (LDOs), and Twinax flyover, etc. Embodiments of the present disclosure address these challenges. For example, CPOs aim to reduce PCB length by putting the optics on the same substrate as the chip and thus reducing SerDes power. CPOs cause a significant change to the technical ecosystem, and also to the business ecosystem. VLCs use existing PCB technology to shorten PCB length, but is ineffective. LDOs eliminate the DSP power in the optical plug. Embodiments described herein improves the signal integrity between integrated circuit chips (e.g., application specific integrated circuit chips) and associated ports (e.g., pluggable optical modules) by shortening the PCB length to the ports. Twinax flyover may effectively reduce loss, but it is expensive, requires expensive board assembly, and adds connectors to the link, which diminish the benefit.

Embodiments described herein shorten PCB tracks as much as possible. Embodiments also have superior attributes relative to VLC, which is accomplished by wrapping the ports or cages thereof around 3 sides of the mainboard integrated circuit or ASIC in a geometry that minimizes distance. Embodiments use a geometry that maintains visibility, installation, and cooling. Shorter PCB tracks reduce high-speed serial signal loss, allow increased signal density, while keeping loss constant, and/or combination thereof. Embodiments reduce high-speed serial signal loss and contributes to power savings by both primary and secondary effects.

Embodiments enable lower-loss interconnect enables reduced transmit signals, while maintaining sufficient receiver performance associated with bit error ratio (BER), frame loss ratio, etc. A reduced transmit signal level reduces the power dissipation in the interconnect and receiver termination directly. Power in the transmitter termination may also be reduced in voltage mode drivers or by reducing the transmitter driver power supply in current mode drivers.

Baseband electrical interconnect loss increases with frequency and that characteristic increases with length. Interconnects that are more highly frequency dependent demand progressively more powerful receivers in order to maintain adequate receiver performance. Some examples of functions that may need to be added are listed below. These functions are typically added incrementally, and in some cases the lowest power solution may result from using a non-incremental subset. Each additional functions requires the addition of more circuitry or logic leading to increased power dissipation. Embodiments described herein address these challenges, including other challenges associated with increased drive voltage, transmitting (TX) equalization, receiving (RX) equalization, data retiming, multiple layers of forward error correction (FEC), complex receiver designs employing maximum-likelihood sequence estimation (MLSE) equalizers instead of simple decision slicers, etc.

Fundamentally, there are physics limitations to the signal loss that result from conductor loss mechanisms (e.g., resistance and skin effect, etc.). These limits reduce the achievable signal bandwidth density. As such, limiting the signal length enables higher signal bandwidth density, which embodiments described herein provide. Embodiments described herein are compatible within the overall router architecture and reduces overall power consumption to the benefits of user/customers. Embodiments provide a cell fabric that flattens leaf-spine hierarchy to enable use of fewer ASICs and fewer optical interconnects. Embodiments provide a plug ecosystem for fabric ports, which enables the lowest-power technology to be employed for each reach, including digital-to-analog converts (DACs), linear amplifier ACC, E-tube, uLED, LD short-reach optical, retimed LR optical, coherent optical, etc.

Embodiments provide liquid cooling, which reduces fan power and heating, ventilation, and air conditioning (HVAC) power. Embodiments described herein may stand independently from a router. Embodiments may be applied beyond routers and may improve top-of-rack switches, servers, artificial intelligence (AI)/machine learning (ML)/high-performance computing (HPC), etc.

FIG. 1 illustrates a perspective view, a top view, and a front view of one embodiment of a circuit pack, circuit card, and/or circuit card assembly, suitable for use with a shelf system. Shown is a circuit pack, circuit card, and/or circuit card assembly (circuit pack 12) suitable for use with a shelf assembly 10 (see FIG. 3). The shelf assembly 10 is adapted to receive the inserted conformal circuit pack 12. This example circuit pack 12 may include client ports to be switched and may be referred to as a client box, which may also include fabric ports to exchange data with a second type of fabric box circuit pack, which may be referred to as a fabric box. An example fabric box circuit pack is described below in connection with FIG. 2.

As shown, a circuit card assembly includes a chassis, housing, case, and/or enclosure (enclosure 14) that is adapted to receive a single or multiple inserted circuit packs 12 in a vertical configuration. For example, the enclosure 14 may include one or more card guides configured to accept one or more circuit packs 12. The terms chassis, housing, case, and/or enclosure may be used interchangeably. The enclosure 14 defines an opening adapted to provide access to a plurality of ports of the circuit pack 12, where the circuit pack 12 is adapted to be inserted into the shelf assembly 10. The enclosure 14 may further include one or more faceplates and/or cover plates completing one or more of the broad sides such that a mechanical enclosure (e.g., a full or partial enclosure 14) is formed.

Each circuit pack 12 includes a printed circuit board or printed circuit board assembly (PCB 16) that includes an integrated circuit chip 18 or ASIC chip or ASIC 18 and multiple additional components that are not described in further detail here. While an ASIC chip is a particular type of integrated circuit chip, the terms integrated circuit chip, ASIC chip, and ASIC may be used interchangeably depending on the context. In various embodiments, the integrated circuit chip 18 may be other types integrated circuit chips. As illustrated, the side edges 20a and 20b of PCB 16 or a surrounding frame may be used as a mounting guide for inserting the circuit pack 12 into the shelf assembly 10, which may include a plurality of corresponding guide rails (not shown). The circuit pack 12 also includes ports (e.g., ports and/or cages thereof) provided on PCB 16, such as a plurality of ports coupled to the PCB 16 and disposed around the integrated circuit chip 18. In various embodiments, the ports are angled relative to a front faceplate of the enclosure 14 such that lengths of tracks between the ports and the integrated circuit chip 18 are less than a predetermined maximum length. The predetermined maximum length may vary, depending on the particular implementation. For example, the predetermined maximum may be 5", 4", 3", 2", etc.

As shown, the ports may include a plurality of client ports 22 (e.g., client pluggable optical module ports and/or associated cages thereof) and a plurality of fabric ports 24 (e.g., fabric pluggable optical module ports and/or associated cages thereof) configured to receive a plurality of small plug form factor connectors such as QSFP-DD/OSFP connectors or the like. These ports may include suitable pluggable optical modules (POM) for the associated connector types, individual cages, and connectors or ganged cages and connectors. Example embodiments directed to ports are described in more detail below in connection with FIGS. 6A-6G, for example. As illustrated, in this circuit pack 12, the client ports 22 are disposed at the front face of the circuit pack 12, while the fabric ports 24 are disposed at the front angled corners of the circuit pack 12 on either side of the client ports 22. The ASIC 18 is disposed on the PCB 16 behind the client ports 22 and the fabric ports 24. Although other precise configurations are possible, a common thread is that both the client ports 22 and the fabric ports 24 are accessible from the front of the shelf assembly 10 (see FIG. 3) and the circuit pack 12. As described in more detail below, air cooling is provided to the board components and connections via one or more fans (not shown) disposed at the back of the shelf assembly 10, near backplane 28 (see FIG. 3). The fans are typically configured to generate a front-to-back airflow. However, it should be appreciated that additional or alternatively positioned fans may direct airflow in other directions, such as side-to-side.

In this circuit pack 12, the ports or connections of the ASIC 18 are generally arranged around the perimeter of the generally square ASIC body, with the client ports 22 on the front side and half way or more back along adjacent sides of the ASIC body, for example. On the same chip, the fabric ports 24 may be arranged around the opposite back corners. The track or trace lengths from the client ports 22 to the client connectors of the ASIC 18 are thus relatively short, given the placement of the ASIC 18 behind the client ports 22. The track lengths from the fabric ports 24 to the fabric ports of the ASIC 18 are relatively short, given the placement of the ASIC 18 behind the fabric ports 24, as shown. Note that the terms track and trace may be used interchangeably. The particular track lengths are advantageously short.

In various embodiments, to reduce track lengths as much as possible, the fabric ports 24 (e.g., ports including POMs, e.g., POMs suitable for QSFP-DD/OSFP connectors) that interact with the ASIC 18 are disposed at substantially 45-degree angles to the ASIC 18 on all four corners. The particular angle may vary and will depend on the particular implementation. The ASIC 18 may also be rotated 45 degrees such that the sides of the ASIC body are parallel to the fabric port 24 and/or associated cage surfaces, with the appropriate connections being disposed in closest proximity on the ASIC 18.

In this example arrangement, the client ports 22 are arranged towards the front of the enclosure 14, while the fabric ports 24 are arranged toward the front outer corners of the enclosure 14 and are used for fabric switching. Other configurations are possible. For example, the client ports 22 and the fabric ports 24 may be swapped such that the fabric ports 24 are arranged towards the front of the enclosure 14, while the client ports 22 are arranged toward the front outer corners of the enclosure 14. In another example embodiment, the client ports 22 may be arranged towards the front of the enclosure 14 and toward the front outer corners of the enclosure 14, while the fabric ports 24 may be arranged toward the rear outer corners of the enclosure 14. The placement of client and fabric ports 22, 24 may vary, depending on the particular implementation. In various embodiments, at least some of the ports are stepped relative to each other. In various embodiments, the ports include or are coupled to respective cages such that each cage has a port coupled thereto. As such the ports connected to stepped cages are also stepped relative to each other. In all of these variations, at least some ports whether client ports 22 or fabric ports 24 are configured at an angle relative to the front of the enclosure 14 and stepped relative to each other.

As indicated herein, the side faces of the circuit pack 12 are reserved for mounting guidance when the circuit pack 12 is inserted into a conformal shelf assembly 10. An extended rear portion of the circuit pack 12 disposed between the back corner fabric ports 24 provides area for power entry and handling, control, and liquid cooling entry, when used. In general, the shelf and circuit packs 12 of the present disclosure may utilize air cooling and/or liquid cooling, such as in a hybrid cooling system.

Figure 2:
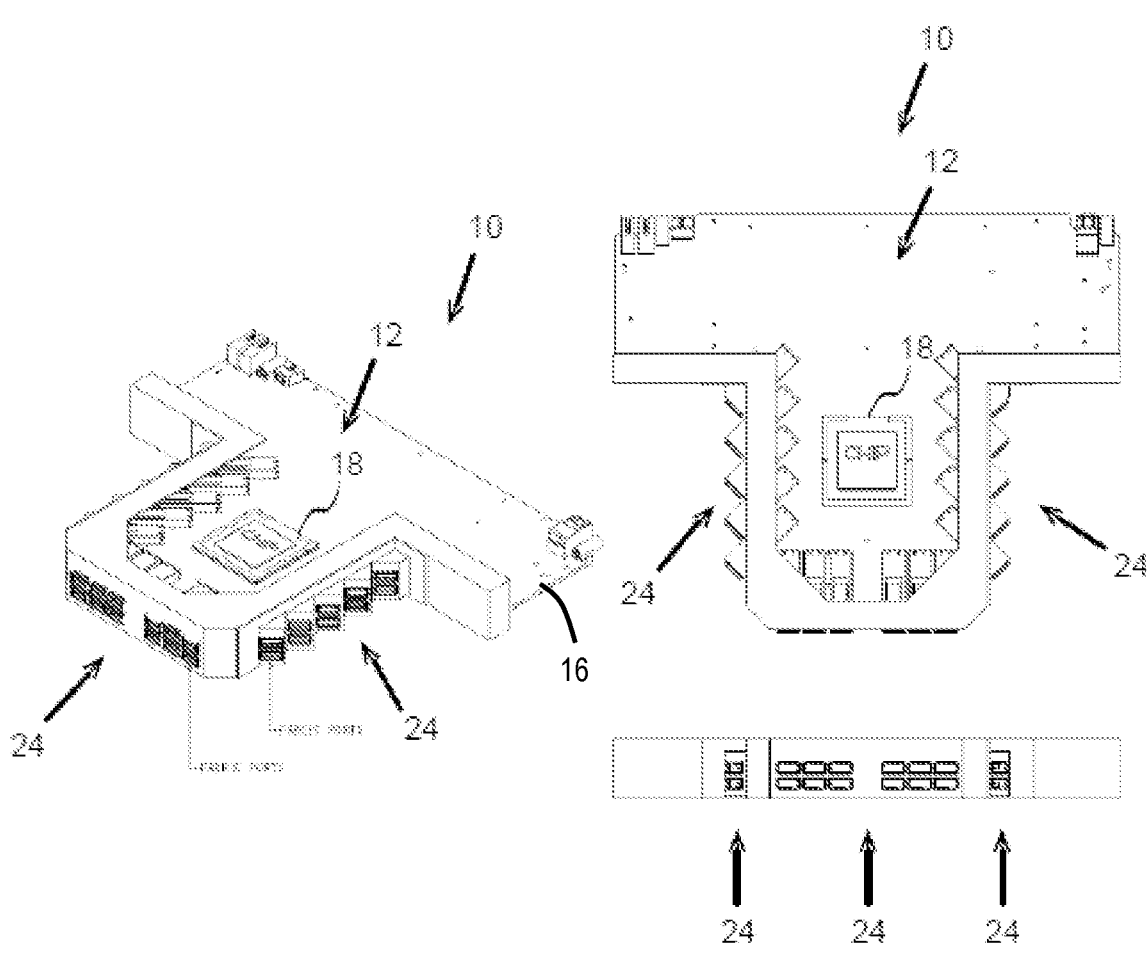
FIG. 2 illustrates a perspective view, a top view, and a front view of one embodiment of a circuit card assembly and circuit pack of a fabric box of the present disclosure.

Again, as contemplated herein, by way of example only, there are two types of circuit packs 12 that may be used in the shelf assembly 10, providing a switching fabric topology. A circuit pack 12 with client ports 22 to be switched may be referred to as a client box as shown in FIG. 1, which may also include fabric ports 24 to exchange data with a second type of circuit pack 12 referred to as a fabric box as shown in FIG. 2, described below. Thus, the present disclosure contemplates multiple similar arrangements of client ports 22 and fabric ports 24 on circuit packs 12 that plug into a suitable shelf assembly (e.g., shelf assembly 10 of FIG. 3), providing three sides of port access with minimized signal track length, reduced power consumption, and improved cooling efficiency.

FIG. 2 illustrates a perspective view, a top view, and a front view of one embodiment of a circuit pack, circuit card, and/or circuit card assembly, suitable for use with a shelf system, in accordance with aspects of the present subject matter. Shown is a circuit pack, circuit card, and/or circuit card assembly (circuit pack 12) suitable for use with a shelf assembly 10 (see FIG. 3). In this example, the circuit pack 12 with fabric ports 24 may exchange data with the fabric ports 24 of a client box circuit pack, such as that of FIG. 1. As shown in FIGS. 1 and 2, the integrated circuit chip 18 is disposed in a central portion of the PCB 16 and between a plurality of fabric ports 24 and/or a plurality of client ports 22 of the plurality of ports.

Figure 3:
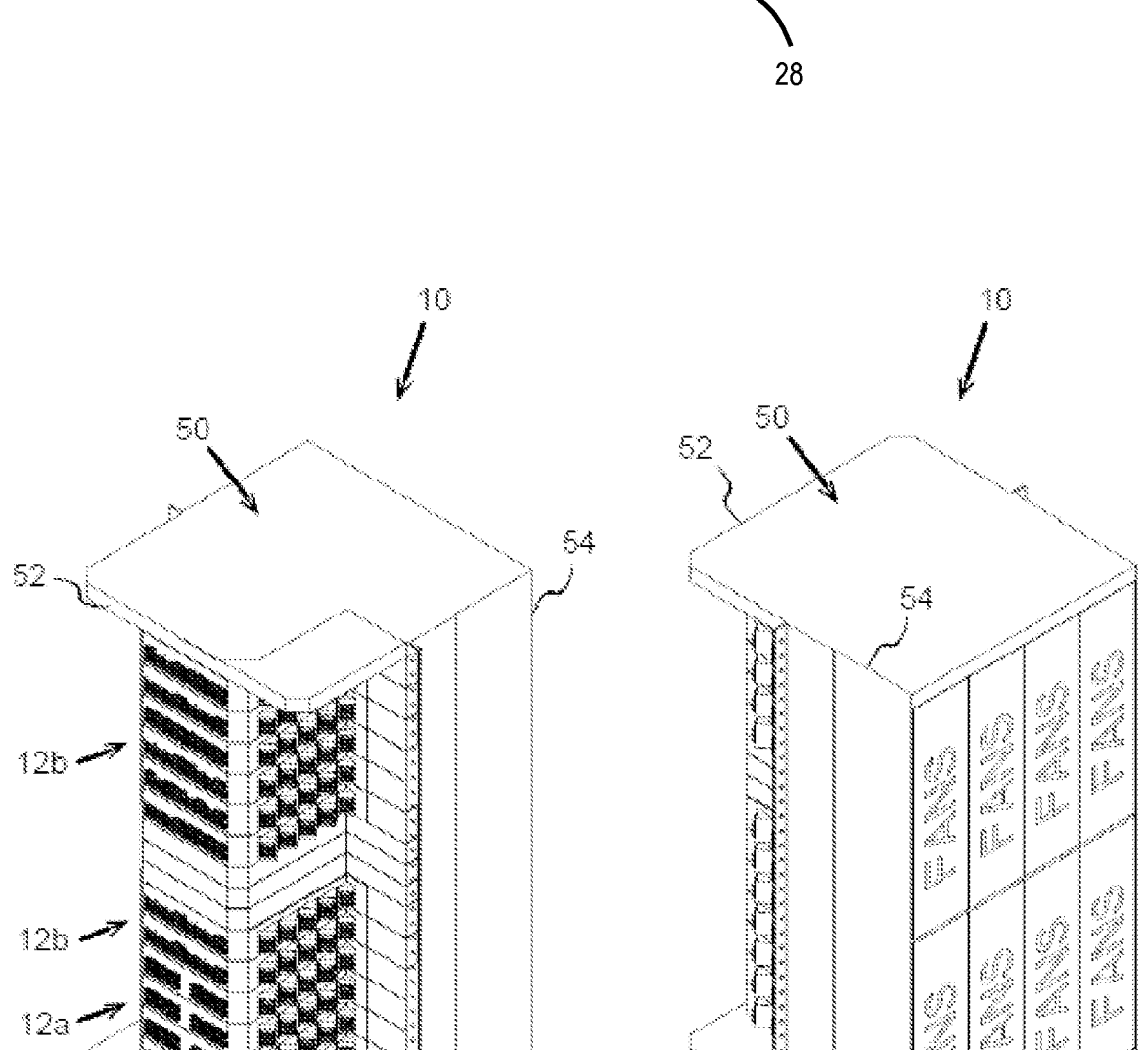
FIG. 3 illustrates perspective top views of the front and back of one embodiment of a shelf assembly of the present disclosure with a plurality of circuit packs installed in a vertical stack.

FIG. 3 illustrates perspective top views of the front and back of one embodiment of a shelf assembly of the present disclosure with a plurality of circuit packs (client boxes 12*a* and fabric boxes 12*b*) installed in a vertical stack. As can be seen, the shelf assembly 10 includes a chassis 50 and circuit packs 12 that include a front portion 52 and a rear portion 54 of the chassis 50 at which the plurality of fans 56 are disposed. From the front, it can be seen that the fabric ports 24 are arranged in a patch panel type of arrangement for fabric cable connections from fabric boxes to client boxes. As shown, the areas at the left and right corners of the front portion 52 of the chassis 50 where connections are made allows for easy hand access. As such, in various embodiments, the ports are accessible from the faceplate and side facing corners of the respective enclosures. Because the ports may include client ports and/or fabric ports, both client ports and/or fabric ports may be accessible from the faceplate and side facing corners of the respective enclosures, depending on the particular implementation.

In some embodiments, the shelf assembly 10 may include LEDs (not shown) that are visible from the front portion 52 of the chassis 50, where the LEDs indicate proper connection of cables to the ports.

Figure 4:
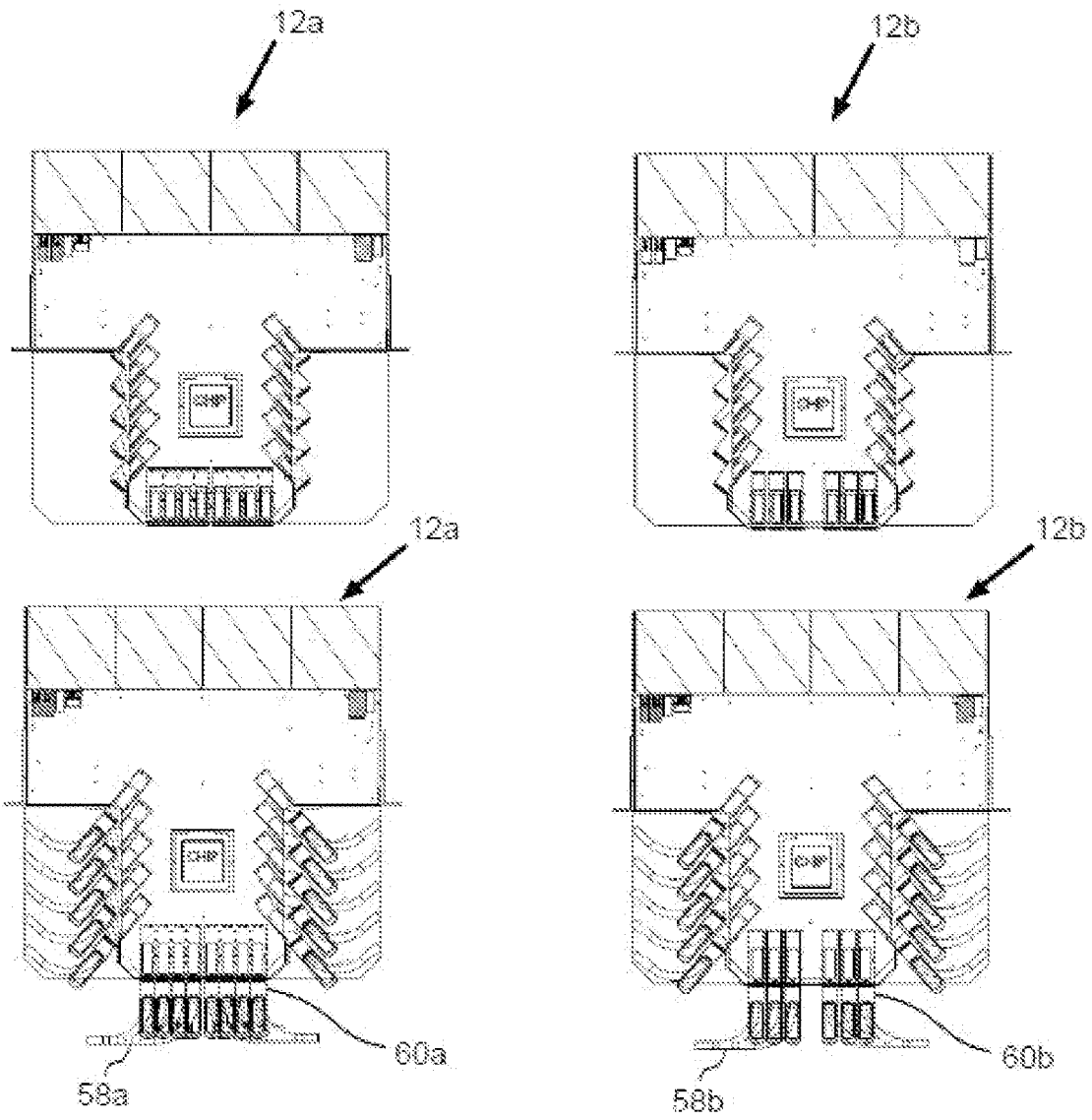
FIG. 4 illustrates top views of embodiments of circuit packs of the present disclosure, which include a client box circuit pack and a fabric box circuit pack.

FIG. 4 illustrates top views of embodiments of circuit packs of the present disclosure, which include a client box circuit pack and a fabric box circuit pack. As shown, circuit packs client boxes 12*a* and fabric boxes 12*b* at the top of FIG. 4 do not have cables currently connected to the ports. The circuit packs client boxes 12*a* and fabric boxes 12*b* at the bottom of FIG. 4 have cables 58*a* and 58*b* currently connected to the ports. As shown with the circuit packs client boxes 12*a* and fabric boxes 12*b* at the bottom of FIG. 4, the cables are connected to handles 60*a* and 60*b*, which are in turn connected to the ports.

Figure 5:
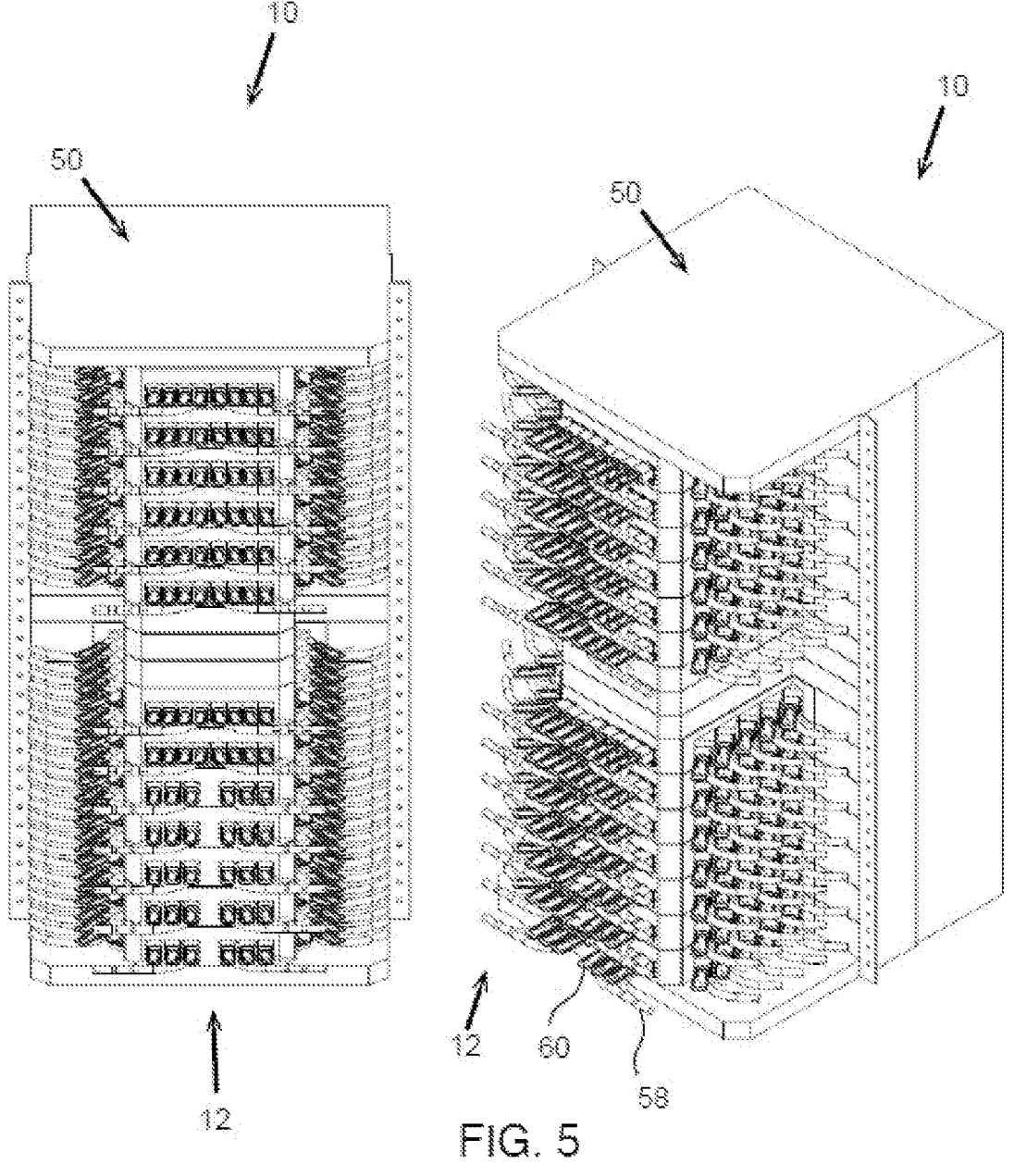
FIG. 5 illustrates a perspective top view and rotated perspective top view of one embodiment of a shelf assembly of the present disclosure with a plurality of circuit packs installed in a vertical stack.

FIG. 5 illustrates a perspective top view and rotated perspective top view of one embodiment of a shelf assembly of the present disclosure with a plurality of circuit packs installed in a vertical stack. As can be seen, the shelf assembly 10 includes a chassis 50 and circuit packs 12. In this example, shelf assembly 10 has cables 58 connected to handles 60, which are in turn connect to ports of the circuit packs 12. The example may be extended to any electrical/optical interface that uses ports, such as ports including POMs (e.g., ports including connectors suitable for QSFP, OSFP, SFO, etc.).

Figure 6A:
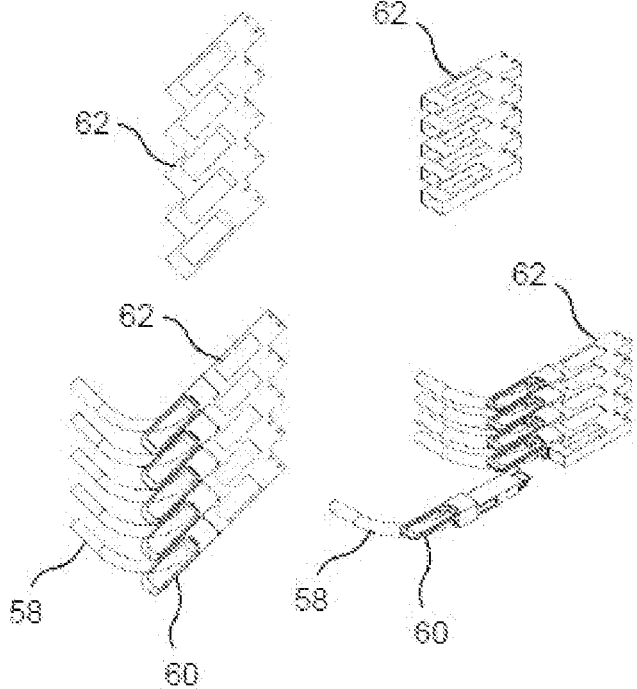
FIG. 6A illustrates top views and perspective views of embodiments of ganged ports of the present disclosure without cables attached and with cables attached.

FIG. 6A illustrates top views and perspective views of embodiments of ganged ports of the present disclosure without cables attached and with cables attached. As shown, ganged ports 62 at the top of FIG. 6A do not have cables currently connected to the ports (e.g., fabric ports 22 and/or client ports 22) thereof. The ganged ports 62 at the bottom of FIG. 6A have cables 58 currently connected to the ports 22, 24 of the ganged ports 62. As shown with the ganged ports 62 at the bottom of FIG. 6A, the cables 58 are connected to handles 60, which are in turn connected to the ports 22, 24 thereof. Each handle 60 is separate from the other handles 60 and each handle 60 may be connected to a respective port 22, 24 of the ganged ports 62. Ganged ports 62 and/or the associated cage(s) thereof are advantageous, because their compact design takes up less faceplate real estate and PCB area. Also, the ganged ports 62 are angled, which allows for much shorter track lengths between each of the ports 22, 24 of the ganged ports 62 and an ASIC chip.

Figure 6B:
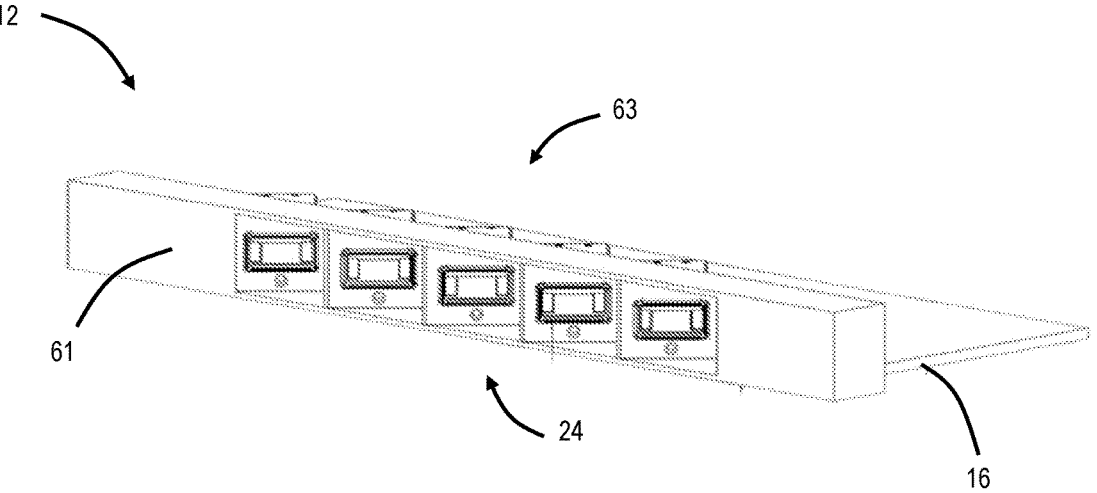
FIG. 6B illustrates a top perspective view of an embodiment of a circuit pack of the present disclosure with individual ports.
Figure 6C:
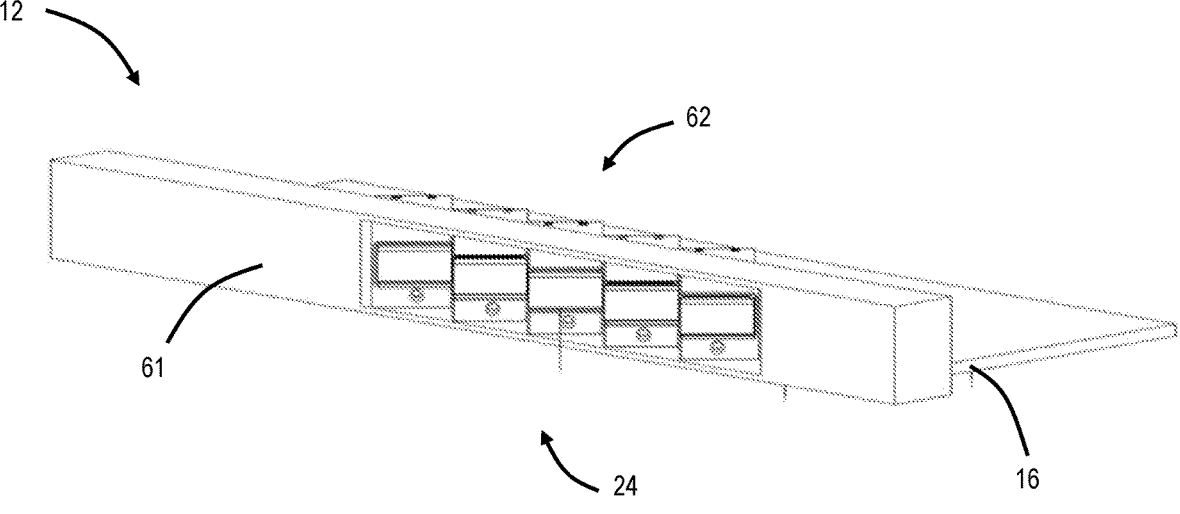
FIG. 6C illustrates a top perspective view of an embodiment of a circuit pack of the present disclosure with ganged ports.

FIGS. 6B and 6C illustrate top perspective views of circuit packs 12 in accordance with aspects of the present disclosure. More particularly, FIG. 6B illustrates a faceplate 61 with ports (e.g., fabric ports 24) connected to slanted individual cages (individual ports 63), and FIG. 6C illustrates a faceplate 61 with ports 24 connected to a slanted ganged cage (slanted ganged ports 62) including five individual cage portions forming a five-port, slanted ganged ports 62. Each circuit pack 12 may generally include a PCB 16, as described herein. Moreover, in certain embodiments, the circuit packs 12 may be configured as or included as a part of a client box 12*a* and/or a fabric box 12*b*. However, it should be appreciated that the disclosed ganged ports 62 may be equally applicable to any suitably configured circuit pack. The examples may be extended to any electrical/optical interface that uses ports, such as ports including POMs (e.g., ports suitable for connectors including QSFP-DD, QSFP, OSFP, SFO, etc.). The ports associated with the individual ports 63 and/or the ganged ports 62 may be configured as fabric ports 24 such as OSFP ports, as shown, but the ports may additionally or alternatively be configured as client ports 22, other ports including suitable POMs, or any combination thereof.

The use of ganged ports 62 slanted or angled with respect to the PCB 16 may generally reduce the footprint of fibers, cables, and the like coupled to the ports 62 within an associated shelf assembly 10. Thus, a circuit pack 12 including the slanted ganged ports 62 may allow for a cabinet door, panel, or the like associated with the shelf assembly 10 to close when such cables in a non-slanted arrangement would otherwise prevent operation of (e.g., fully closing) the cabinet door. Furthermore and as shown, by utilizing the ganged ports 62 rather than two or more individual ports 63 (e.g., a ganged ports 62 associated with the same number of individual ports 63) additional free space on the faceplate 61 is created.

FIG. 6D illustrates a top view of the circuit pack 12 of FIG. 6B including the slanted individual ports 63, and FIG. 6E illustrates a top view of the circuit pack 12 of FIG. 6D including the slanted ganged ports 62. By comparing the circuit packs 12 of FIGS. 6D and 6E, it should be appreciated that the individual ports 63 of FIG. 6D require a greater amount of physical room on the PCB 16. As shown, the use of the ganged ports 62 in lieu two or more the individual ports 63 significantly increases the available free space of the PCB 16. Furthermore and as depicted in FIG. 6E, the spacing between the middle of the portions of the ganged ports 62, e.g., the pitch, is generally less than the pitch between the individual ports 63 of FIG. 6D. Thus, it should be appreciated that the use of the ganged ports 62 may free up enough space on the PCB 16 for one or more additional individual ports 63 and/or ganged ports 62. The ganged ports 62 and/or the cage(s) thereof also generally require a single heat-sink clip as compared to multiple heat-sink clips for individual ports 63, each of which requires a dedicated heat-sink clip, resulting in additional free space on the PCB 16. The use of a single heat-sink clip for ganged ports 62 rather than multiple heat-sink clips for individual ports 63 may further reduce assembly time of and reduce the production cost of the associated circuit pack 12.

Referring now to FIGS. 6F and 6G, embodiments of different arrangements of individual ports 63 and ganged ports 62 are illustrated in accordance with aspects of the present disclosure. Particularly, FIG. 6F illustrates a configuration of ports including ganged ports 62 with two cage portions in combination with two individual ports 63, and FIG. 6G illustrates a configuration of ports including ganged ports 62 with three cage portions in combination with three individual ports 63. While one ganged ports 62 followed by multiple individual ports 63 are depicted (a two-portion ganged ports 62 and/or cage thereof and two individual ports 63 for FIG. 6F; and a three-portion ganged ports 62 and/or cage thereof and three individual ports 63 for FIG. 6G), various embodiments of a circuit pack 12 may include one or more additional ganged ports 62 with the same number of portions, fewer portions, or more portions; one or more additional individual ports 63; and/or fewer individual ports 63. Furthermore, the ganged ports 62 and individual ports 63 need not be grouped as depicted in FIGS. 6F and 6G. For example, the separate ganged ports 62 may be positioned between individual ports 63, two or more individual ports 63 may separate ganged ports 62, etc.

Generally, the required number of ports 24 and the usable area of the PCB 16 may be utilized to determine, at least in part, the number of ganged ports 62 (and the number of portions of the ganged cage or associated ports 24 thereof)

and the number of individual ports 63. More specifically, the amount of additional area of the PCB 16 required and the number of portions of the ganged ports 62 may determine the number of separate ganged ports 62 required, the configuration of such ganged ports 62, and the number of individual ports 63 required. For example, the use of two individual ports 63 as compared to ganged ports 62 and/or the cage(s) thereof with two portions (e.g., configured for use with two ports 24) may result in approximately 12-16% more PCB 16 area utilization, such as 14%; the use of three individual ports 63 as compared to ganged ports 62 with three portions and/or the cage(s) thereof (e.g., configured for use with three ports 24) may result in approximately 16-20% more PCB 16 area utilization, such as 18%; the use of four individual ports 63 as compared to a ganged ports 62 with four portions and/or the port(s) thereof (e.g., configured for use with four ports 24) may result in approximately 18-22% more PCB 16 area utilization, such as 20%; and the use of five individual ports 63 as compared to a ganged ports 62 with five portions and/or the cage(s) thereof (e.g., configured for use with five ports 24) may result in approximately 20-24% more PCB 16 area utilization, such as 22%. It should also be appreciated that certain ports, associated connectors, and/or cages thereof cannot be placed belly to belly (e.g., stacked QSFP-DD ports), and such a connection may require an individual port 63. Thus, the number of connections requiring individual ports (e.g., a slanted individual port(s) 63 for stacked QSFP-DD) may also determine the number of ganged ports 62 (and the number of portions of the associated cage(s) or associated ports 24 thereof) and the number of individual ports 63.

Figure 7:
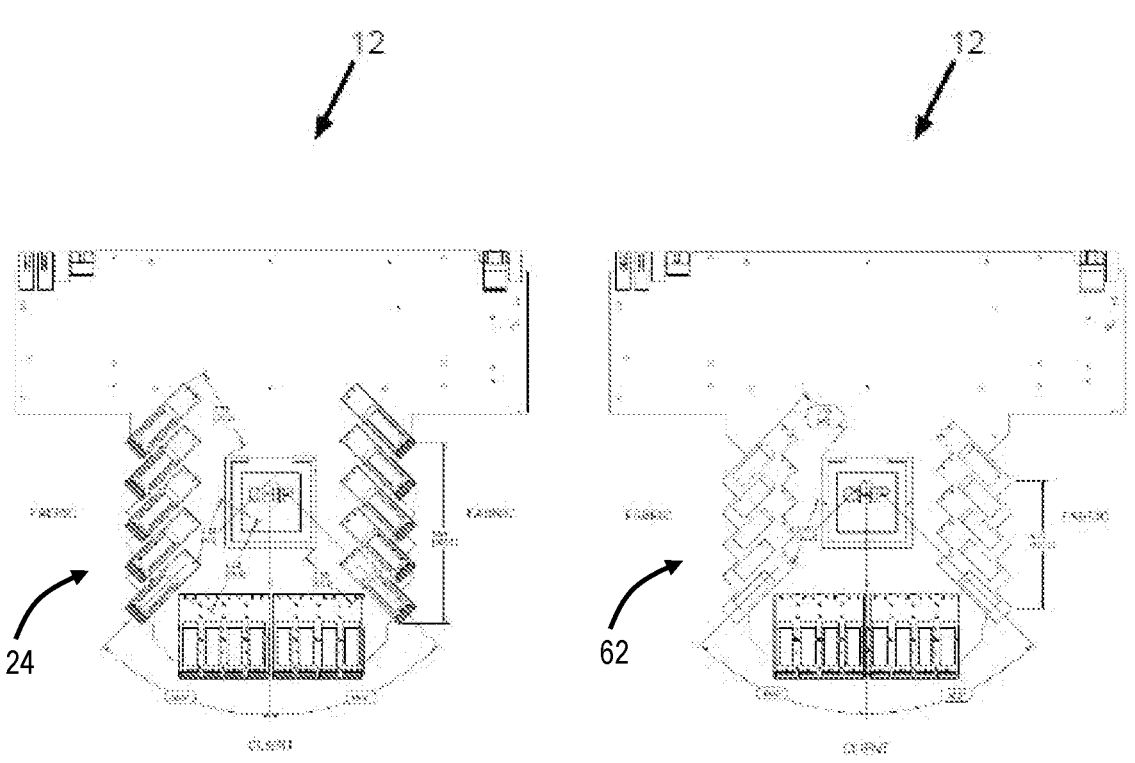
FIG. 7 illustrates top views of embodiments of circuit packs of the present disclosure.

FIG. 7 illustrates top views of embodiments of circuit packs of the present disclosure. As shown, circuit packs 12 on the left of FIG. 7 has ports 24 that are not ganged. The circuit packs 12 on the right of FIG. 7 has ganged ports 62. In both of these examples, the ports 24, 62 whether ganged or not are angled and stepped.

Figure 8:
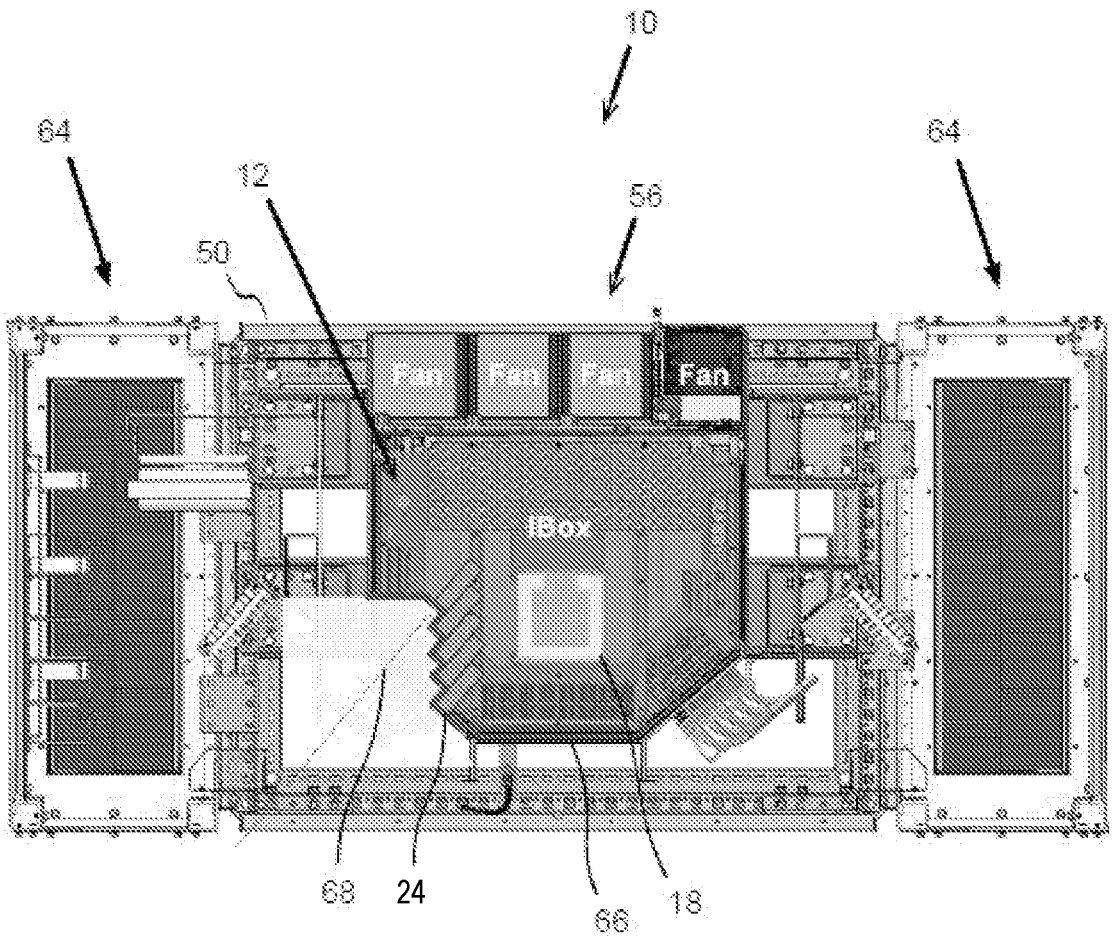
FIG. 8 illustrates a top view section of one embodiment of a shelf assembly of the present disclosure.

FIG. 8 illustrates a perspective top view of one embodiment of a shelf assembly of the present disclosure. As can be seen, the shelf assembly 10 includes a chassis 50, a circuit pack 12, and fans 56. The shelf assembly 10 also includes fiber and cable management bays 64.

Also shown is an ASIC 18, a front faceplate 66, and ports (e.g., fabric 24 and/or client ports 22, reference number 22 omitted for clarity). The front faceplate 66 with the group of the ports 24 may be a predetermined width that is approximately similar to or somewhat wider than the width of the ASIC 18. This allows for an ample amount of space or distance between the ports 24 and the side of the chassis 50. As indicated herein, the angled and stepped ports 24 have a placement at a 45-degree angle to the front faceplate 66 on both the left and right sides of the ASIC 18. The particular angle of the of ports 24 may vary, depending on the particular implementation.

As shown, the ports 24 being angled and stepped are setback toward the ASIC 18 of the circuit packs 12 such that the deepest port 24 has straight-line visibility 68 (indicated with a dotted line) by an installer without the cabinet front post blocking the view. The straight-line visibility 68 maintains line-of-sight such that port LEDs are visible to ease installation of plugs and indicate connectivity. In other words, the setback is sufficiently large so as to enable hand/finger room to insert/remove the deepest plug.

Ganged versions of the angled and stepped ports 24 (e.g., ganged ports 62 of FIGS. 6 and 7) groups the ports 24 more closely than single, individual ports, which enables an even smaller footprint.

Figure 9:
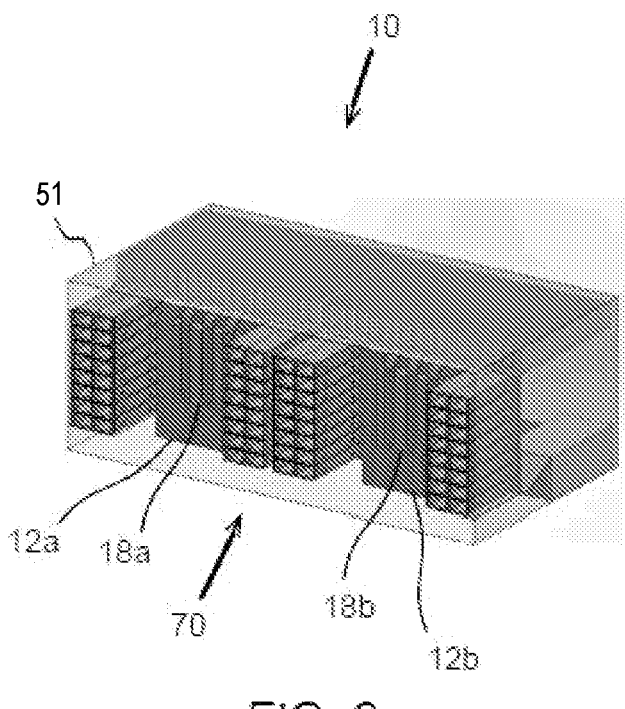
FIG. 9 illustrates a perspective top view of one embodiment of a shelf assembly in a chassis.

FIG. 9 illustrates a perspective top view of one embodiment of a shelf assembly configured as a VLC system in a chassis. As shown, the shelf assembly 10 is in a chassis 51. Shown are small form factor pluggable (OSFP) ports 70 at the front of the shelf assembly 10. In this example embodiment, there are two circuit packs 12a and 12b with respective ASICs 18a and 18b.

Figure 10:
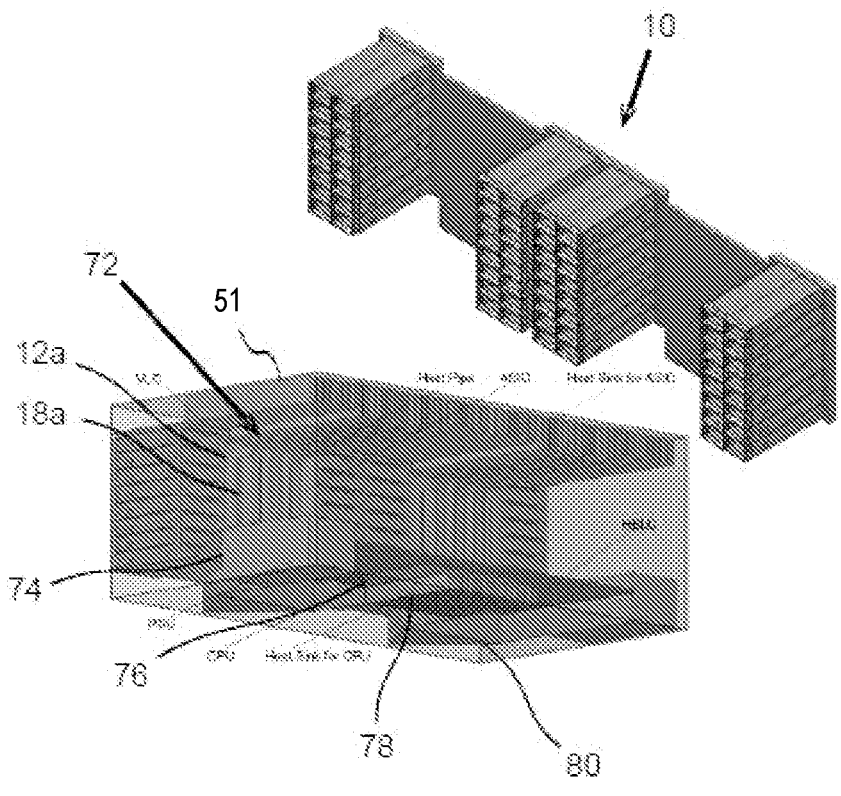
FIG. 10 illustrates perspective top views of one embodiment of a shelf assembly outside of a chassis and in a chassis.

FIG. 10 illustrates perspective top views of one embodiment of a shelf assembly configured as a VLC system outside of a chassis and in a chassis. Shown are circuit packs such as circuit pack 12a, corresponding heat pipes 72 attached to respective ASICs such as the ASIC 18a. The heat pipes 72 draw heat away from heat sources such the ASIC 18a. Also shown is a power supply unit (PSU) 74, a central processing unit (CPU) 76, and a heat sink 78 for the CPU 76 on a horizontal line card (HBLC) 80.

Ortho-direct chasses are common in the industry. They have 3-foot-tall fabric cards with very long PCB tracks. This increasingly burns more and more power as SerDes rates increase. Embodiments described herein avoid such long tracks and externalizes optical links and thus reduces power.

As described in the various embodiments herein, the physical placement of ports around the ASIC, where the ports are angled and stepped enables beneficial cooling and setback of the ports and/or cages thereof. Embodiments enable substantially shortened track lengths such that XSR SerDes work rather than requiring VSR SerDes. 1.5" PCB tracks @ 0.85 dB/inch, for example, may achieve a little as 1.3 dB PCB loss. The port connector is 2 dB and the module PCB is 2 dB, totaling is 5.3 dB, which fits under a 6 dB XSR budget.

Figure 11A:
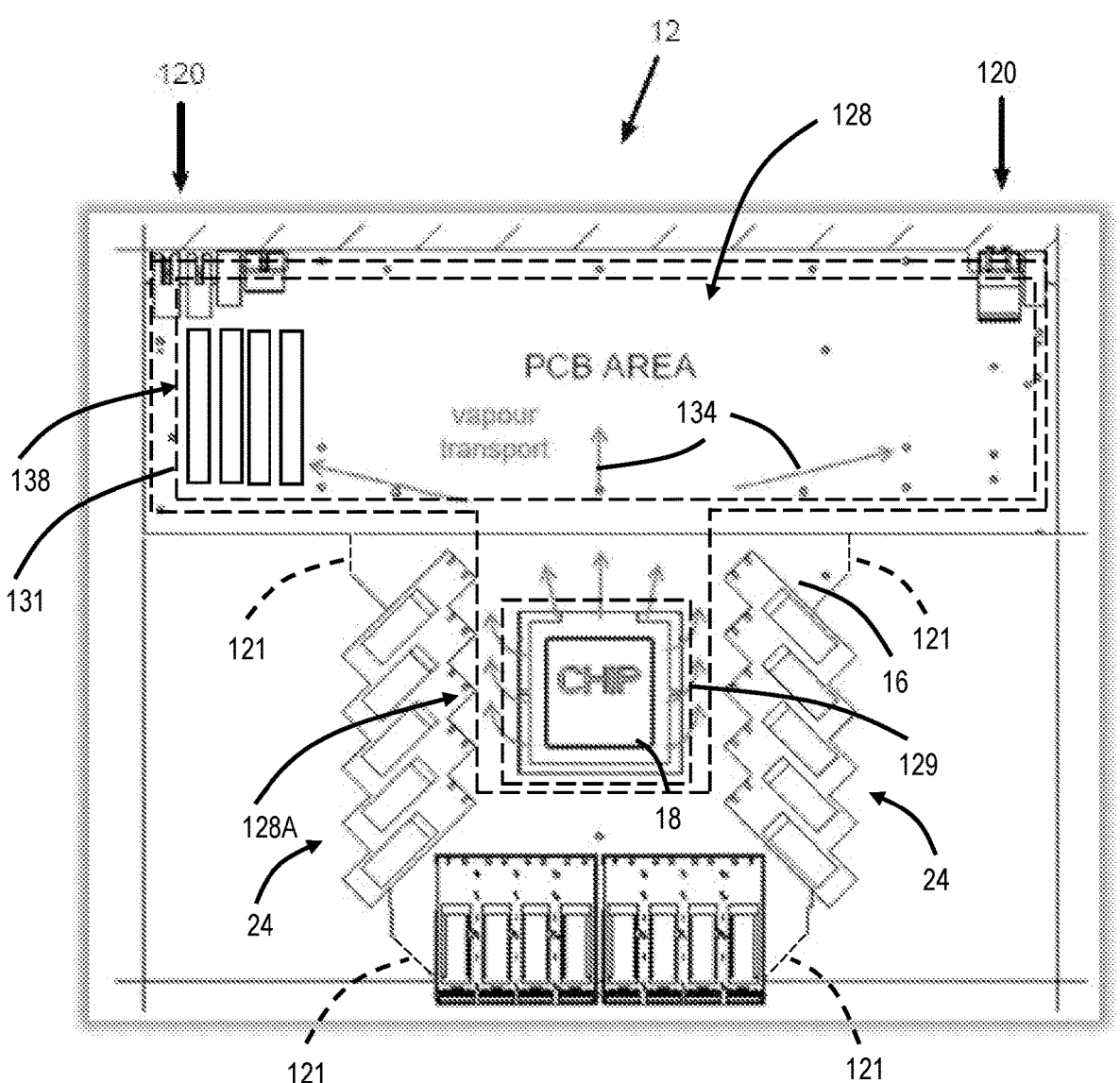
FIG. 11A illustrates a top view of one embodiment of a circuit pack of the present disclosure showing a mass flux of vapor within a vapor chamber.

FIG. 11A illustrates a top view of one embodiment of a circuit pack of the present disclosure showing a mass flux or flow of vapor within a heat sink. A heat sink and/or cold plate of the circuit pack 12 may generally be configured as a vapor chamber 128 (shown with dashed lines in FIG. 11A). In additional or alternative embodiments, the heat sink may include heat sink fins 138 (e.g., parallel plate heat sinks, pin fin heat sinks, liquid-cooled cold plates, heat pipe assemblies, and/or vapor chamber heat sinks) within a condenser 131 of the vapor chamber 128 and configured to transfer heat from a heat source of the circuit pack 12. It should be appreciated that a portion of the heat sink fins 138 are shown in FIG. 11A and that the vapor chamber 128 may include as many heat sink fins 138 as desired or required, such as substantially filling the available space above the condenser 131. In the embodiment of FIG. 11A, the heat source is the ASIC 18, but, in other embodiments, the heat source may include one or more other suitable devices or associated case(s) such as a port(s) (e.g., POM port(s)), a CPU, a GPU, an FPGA(s), a power FET(s), an integrated circuit, a suitable chip(s), or the like. Generally, the vapor chamber 128 may cool the ASIC 18. However, additional or alternative configurations of the vapor chamber 128 may cool other heat sources of the circuit pack 12, e.g., the ports thereof.

Embodiments of the of the disclosed vapor chamber 128 may provide a high mass flux of cooling vapor and/or cooling liquid flow (cooling fluid) proximate to one or more heat sources (e.g., the ASIC 18) associated with the PCB 16 of the circuit pack 12. The flow of cooling fluid cooling the heat sources of the circuit pack 12 is represented by the arrows of FIG. 11A (vapor path 134). The vapor path 134 is generally configured to flow the cooling fluid over the heat source(s) (e.g., the ASIC 18) of the circuit pack 12 within an evaporator 129 of the vapor chamber 128, which is in contact with the heat source(s), to the condenser 131, which is physically positioned some distance away from the evaporator 129, such as outside of the enclosure 14 of the circuit pack 12. Heat absorbed by the cooling fluid within the evaporator 129 is generally dumped to the environment surrounding the circuit pack 12 by the condenser. In some embodiments, the circuit pack 12 may include a dedicated vapor chamber 128A for the ASIC 18 (e.g., an ASIC vapor chamber 128A including its own evaporator and condenser) in addition to or as an alternative to the vapor chamber 128 of the circuit pack 12. In some embodiments, the ASIC vapor chamber 128A may transfer heat from the ASIC 18 to the vapor chamber 128.

As shown in FIG. 11A, close to the ASIC 18 the geometry of the vapor chamber 128, the evaporator 129, and/or the ASIC vapor chamber 128A is constrained by the presence of the angled ports (e.g., fabric ports 24). Furthermore and as illustrated, the mass flux (e.g., an amount of mass flux measured in kg/m²s) of the vapor within the vapor path 134 surrounding the heat source and/or ASIC 18 is generally increased in response to the constrained geometry in this region, resulting in increased flow resistance limiting the thermal performance of the vapor chamber 128. Thus, embodiments of the heat sink and/or vapor chamber 128 disclosed herein reduce flow resistance of the cooling fluid in the portion of the vapor path proximate the heat source and/or the evaporator 129, as described below with respect to FIG. 12, in order to improve the thermal performance of the vapor chamber 128.

Figure 11B:
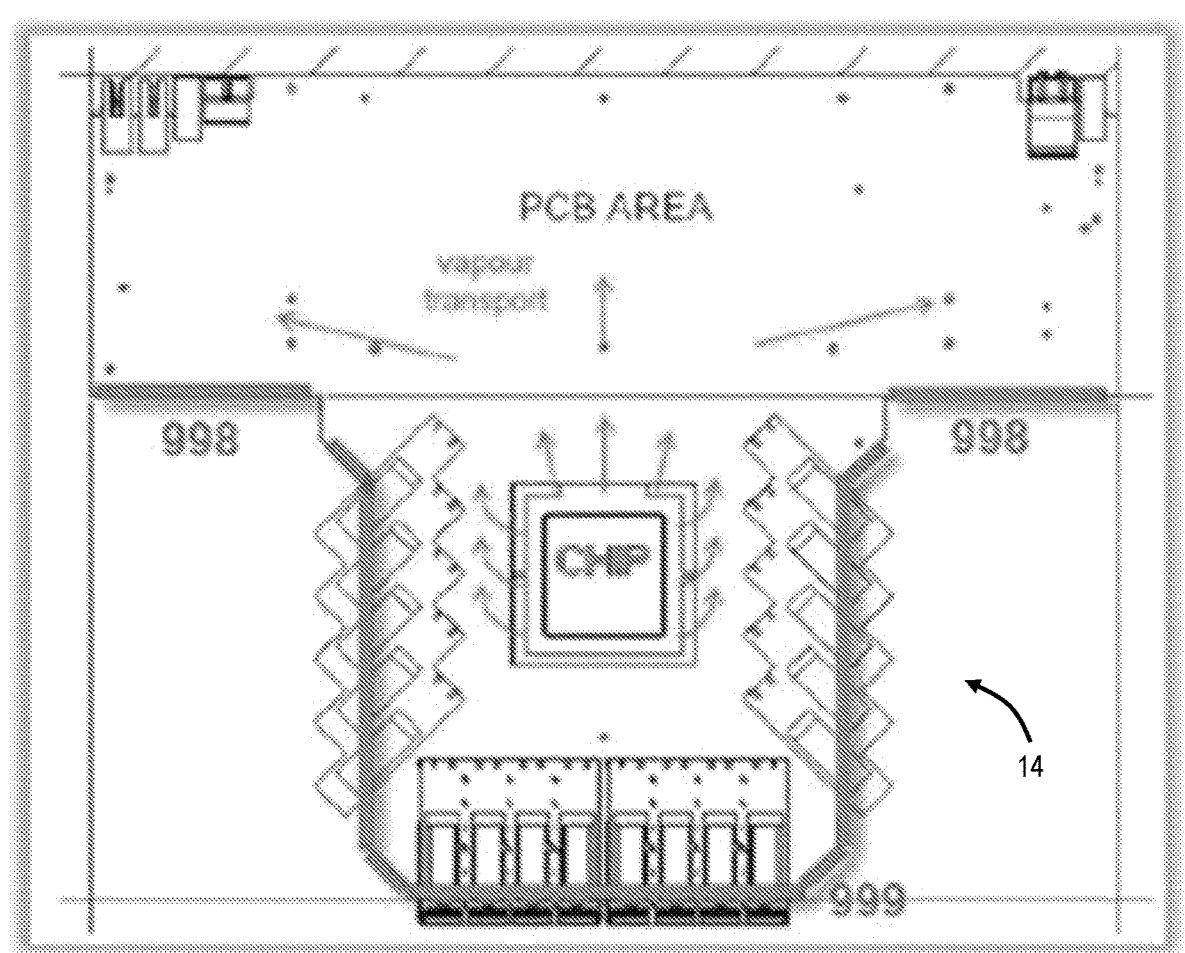
FIG. 11B illustrates a top view of one embodiment of a circuit pack of the present disclosure showing perforations of an enclosure thereof.

In additional or alternative embodiments, air flow suitable for cooling components included on the PCB 16 (e.g., the ASIC 18 and/or the ports of the circuit pack 12) and/or fins associated with the vapor chamber 128 may be supplied by one or more perforations (e.g., perforations 121 depicted in dashed lines in FIG. 11A) in the faceplate adjacent to the ports and/or by perforations 121 in the other forward-facing faceplate surfaces rear of the ASIC 18. In various embodiments, the air flow for cooling components included on the PCB 16 may flow from the front (e.g., front plate and/or from perforations 121) to the rear of the circuit pack 12 where the outlets 120 are located, as indicated by the arrows. The positions of perforations 121 and the outlet(s) 121 and direction of the associated air flow for cooling components may vary, depending on the particular implementation. In additional or alternative embodiments and shown in FIG. 11B, additional or alternative perforations (e.g., perforations 998 and/or perforations 999), may be provided in the enclosure 14 and/or one or more of the associated faceplates of the circuit pack 12 in order to provide airflow over the vapor chamber condenser.

Figure 12:
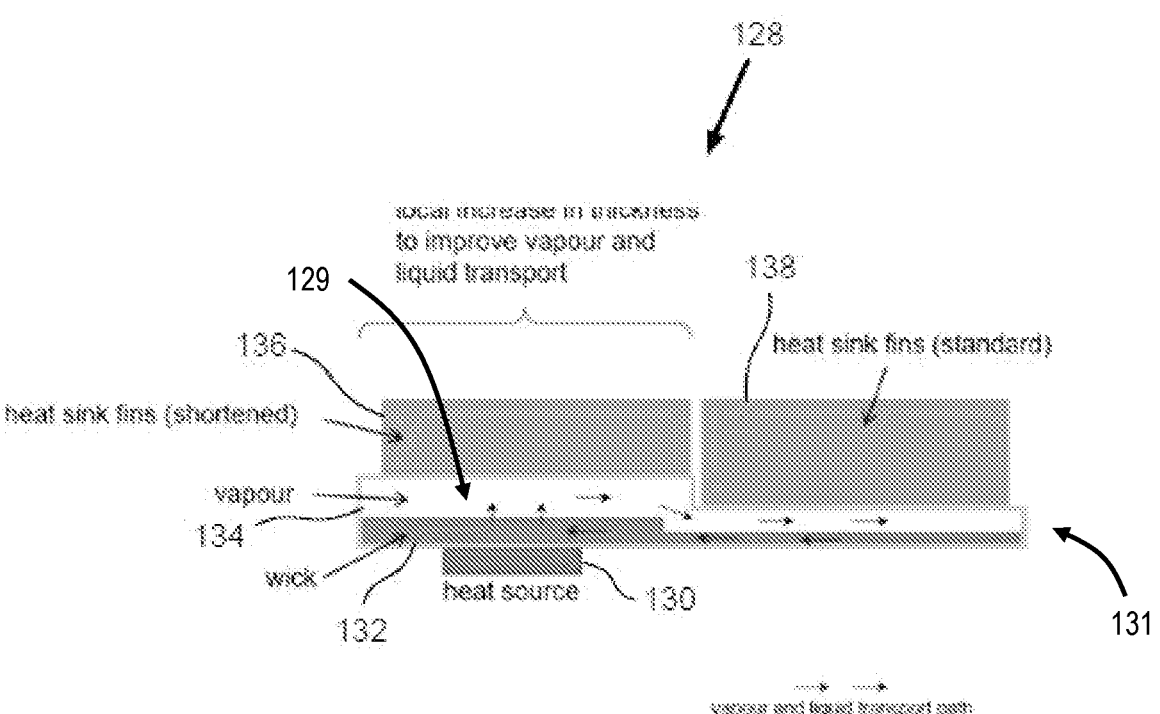
FIG. 12 illustrates a side view of one embodiment of a vapor chamber of the present disclosure.

FIG. 12 illustrates a side view of one embodiment of a heat sink of the present disclosure. As shown, a vapor chamber 128 of the heat sink may include a cooling assembly in the enclosure of a circuit pack (e.g., any of the circuit packs 12 described herein). The vapor chamber 128 is disposed over a heat source 130, which may be an ASIC, for example. The vapor chamber 128 is disposed within the enclosure and adjacent to a component side of the PCB 16 (omitted from FIG. 12). The vapor path 134 within the evaporator 129 directs cooling fluid across the component side of the PCB 16 to transport heat away from one or more heat sources 130, such as an integrated circuit chip or ASIC. For example, the cooling fluid within the evaporator 129 may absorb heat from the heat source 130 and change the cooling fluid from a liquid state to a vapor state, with the vapor then traveling toward a condenser 131 with some associated hydraulic resistance which depends on the geometry of the inside of the vapor chamber 128.

The cooling fluid in its vapor state follows the vapor path 134 away from the heat source 130 to carry heat away the heat source 130. For example, the cooling fluid flows from the evaporator portion of the vapor path 134 to a portion of the vapor path 134 within the condenser 131. The flow of the cooling fluid within the portion of the vapor path 134 of the condenser 131 may transfer the heat carried by the cooling fluid to the surrounding environment of the circuit pack and change the cooling fluid from the vapor state back to the liquid state and/or otherwise condense the cooling fluid. Cooling fluid in its liquid state circulates back to the heat source 130 via a wicking mechanism or wick 132 disposed in a contiguous area from the condenser 131 to the evaporator 130. The wick 132 generally transports the cooling fluid back to the evaporator 129, completing a fluid circuit of the vapor chamber 128 and/or vapor path 134.

As illustrated in FIG. 12 and in some embodiments, heat sink fins 136 and 138 are disposed over the vapor chamber 128 and/or vapor path 134 to further draw heat away from the heat source 130. As shown, the top surfaces of heat sink fins 136 and 138 are at substantially the same height or substantially flush at their top surfaces, where the heat sink fin 136 directly above the heat source 130 is thinner than the other heat sink fins such as heat sink fin 138. This allows room for a thicker or bigger portion of the vapor path 134 directly above the heat source 130, for increased flow.

Given the close proximity of ports to the ASIC, and how this arrangement constrains the size and shape of the vapor chamber 128, the thickness of the vapor chamber 128 may be increased as necessary to ensure that hydraulic resistance of the vapor path 134 is sufficiently low, and that the vapor chamber 128 performs as required. The thickness elsewhere may be maintained, or the thickness may be minimized for maximum heat sink fin area, as shown. In one embodiment of the vapor chamber 128, the inside thickness of the vapor path 134 (i.e. the dimension normal to the PCB 16) may be 6 mm in all areas excluding the evaporator 129. In the evaporator region however, and somewhat adjacent to evaporator 129, the inside thickness may be increased to 9 mm for example. This thickness increase in the evaporator region, and somewhat adjacent to the evaporator 129, increases the cross-section area for vapor transport, in particular where vapor mass flux—and speed—is the greatest, and allows for a lower peak speed, and therefore lower hydraulic resistance of the vapor path 134. The thickness increase allows for a greater wick cross-section and/or improved wick structure 132 where the return-liquid speed is greatest. These improvements (e.g., vapor speed reduction, hydraulic resistance reduction, wick-structure, etc.) all serve not only to maximize vapor chamber performance, but also keep the vapor chamber 128 from reaching its physical limits of use (e.g., dry-out, etc.). In the regions farther from the ASIC, the thickness may be minimized (e.g., <=6 mm; as desired to preserve maximum heat sink fin surface area wherever possible, etc.).

Figure 13:
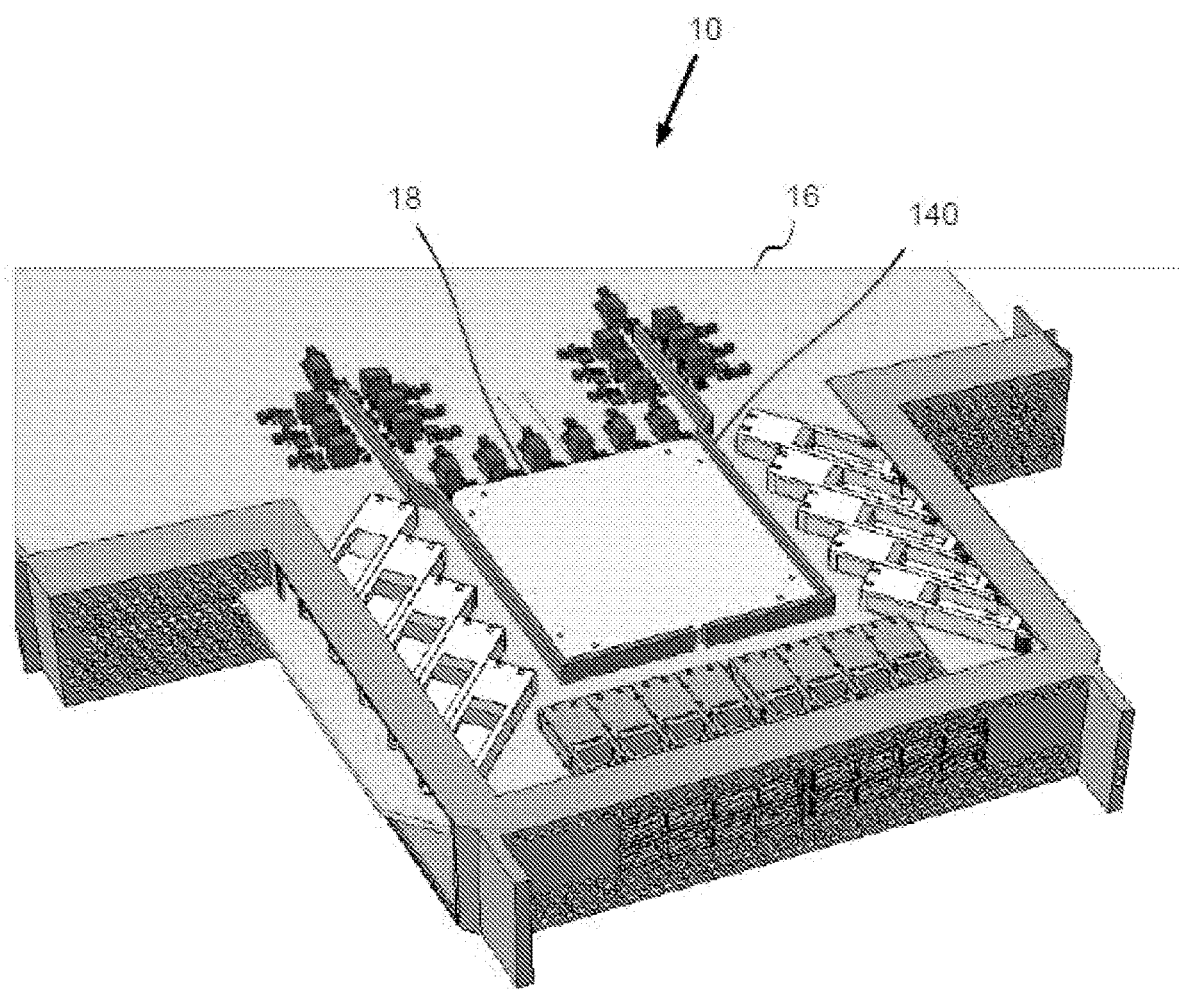
FIG. 13 illustrates a perspective top view of one embodiment of a circuit pack of the present disclosure, with attention to a footprint of an ASIC power supply circuit.

FIG. 13 illustrates a perspective top view of one embodiment of a circuit pack of the present disclosure showing a footprint of an ASIC power supply circuit. As shown, an ASIC 18 is disposed on the PCB 16 of the circuit pack 10. In various embodiments, a busbar 140 is coupled to the PCB 16 and disposed conformally around at least a portion of the perimeter of the ASIC 18. The space between the ports and the ASIC 18 allows for ample room for the busbar 140 to be disposed around the perimeter of the ASIC 18. The busbar 140 enables additional connections between the ASIC 18 and other circuitry on the PCB 16.

Figure 14:
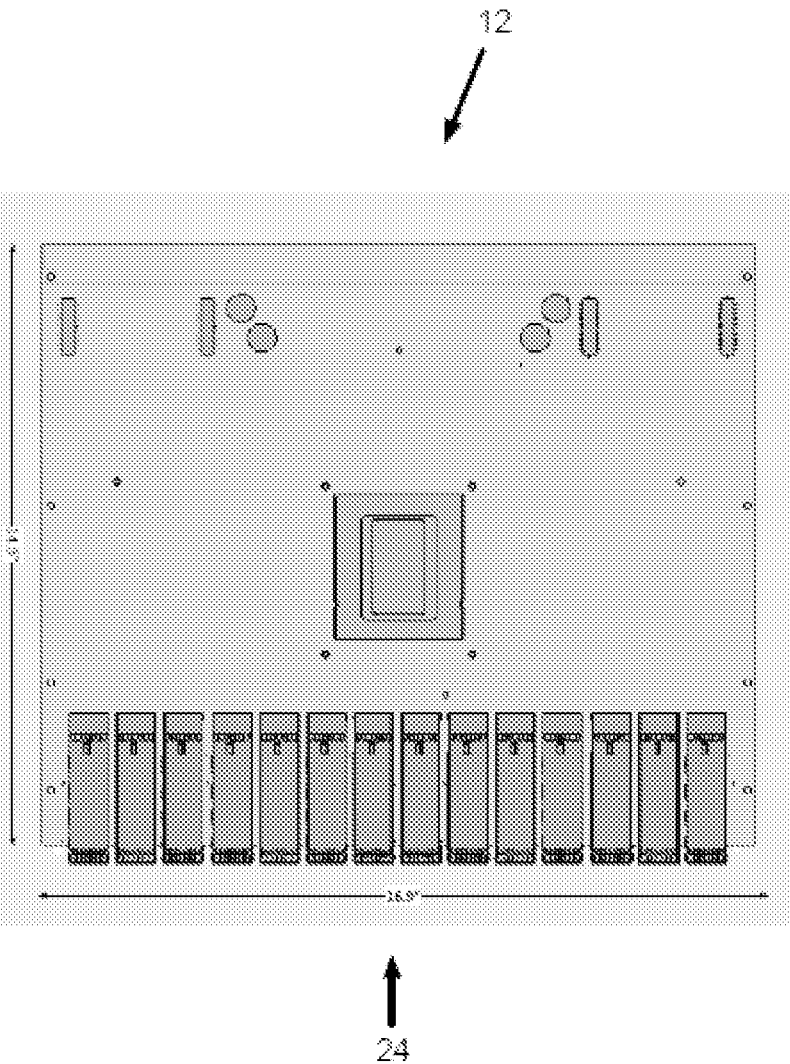
FIG. 14 illustrates a top view of a conventional circuit card floor plan.

FIG. 14 illustrates a top view of one embodiment of a conventional circuit card floor plan. In this particular example, a standard circuit card is shown having 14 OSFP ports 24. The ports shown are fabric ports 24 in this example, but may also be client ports 22, or any combination thereof.

Telecom products typically include multiple ports such as optical ports. Optical ports may have different speeds such as 10G, 100G, 400G, etc. Optical ports may also have different form factors such as small form factor 28 Gbps (SFP28), quad SFP 28G (QSFP28), quad SFP double density (QSPFDD), C form-factor pluggable 2-digital coherent optics (CFP2-DCO), Octal SFP (OSFP), etc. Optical port form factors have different standard dimensions.

In various embodiments, 100G/400G optical ports generally have form factors of QSFP-DD and CFP2-DCO. Future high speed optical ports with speed support of 800G/1.6T may have different form factors based on how technology develops. As per current information, in various embodiments, OSFP form factor applied for these speeds.

The speed of 800G/1.6T may have PCB tracing running at speeds of 112 Gbps/224 Gbps. Routing such traces on a PCB will have stringent system integration (SI) requirements. With the critical SI requirements, placement of the components such as the various angled and stepped placements described herein is important and beneficial.

Embodiments described herein address challenges with the placement of non-angled and non-stepped ports 24, as shown in FIG. 14. For example, the trace length of SerDes traces for extreme left and right ports may go up to 10", which creates an SI issue at speeds of 112G/224G per lane.

If retimer/redriver functionality are added in between a trace for extreme ports to have individual section of trace within around 5", then bill of materials (BOM) cost and circuit complexity increases. Thermal challenges may also increase as retimers/redrivers require their own cooling arrangements. Furthermore, there may be real state challenges with retimers to put on a PCB. Embodiments described herein such as the circuit pack of FIG. 15, for example, address these challenges.

Figure 15:
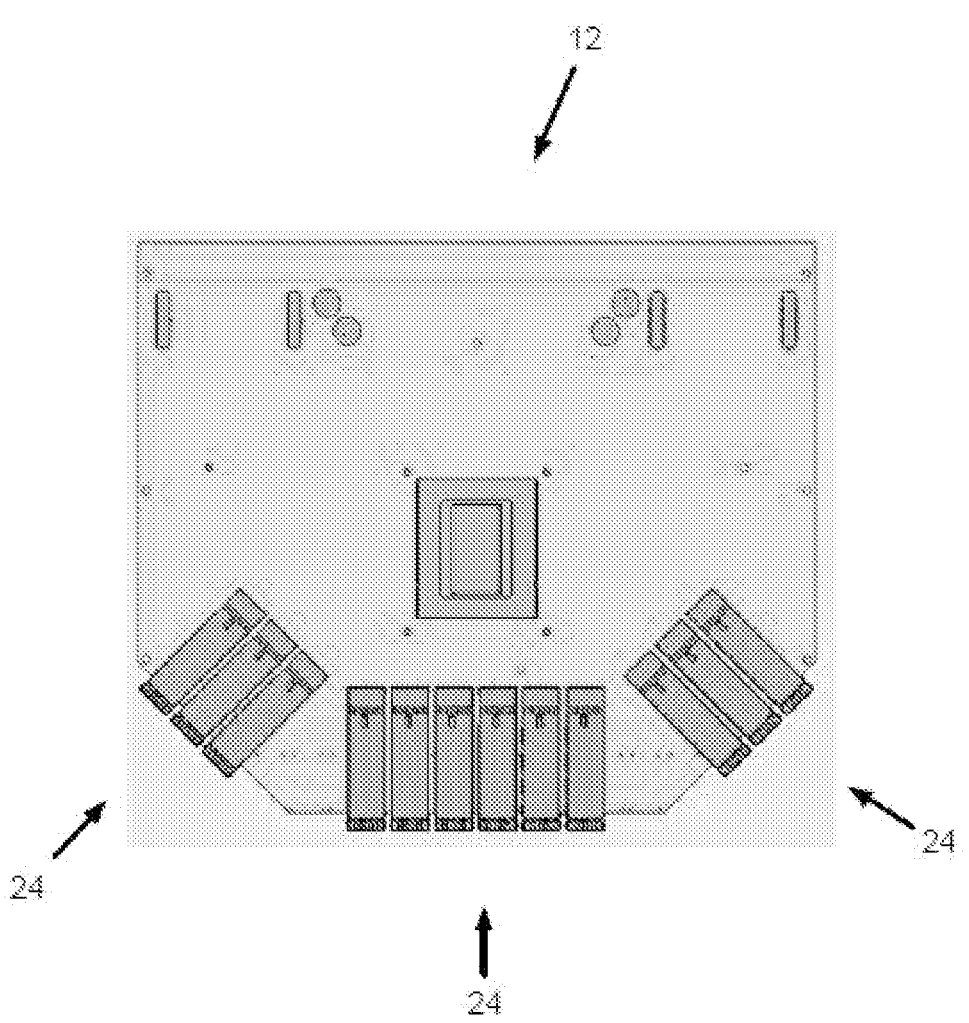
FIG. 15 illustrates a top view of one embodiment of a circuit pack of the present disclosure.

FIG. 15 illustrates a top view of one embodiment of a circuit pack of the present disclosure. Shown is a circuit pack 12 having OSFP ports 24 placed on a PCB board with slant edges. The ports shown are fabric ports 24 in this example, but may also be client ports 22, or any combination thereof. The slanted PCB edges of the circuit pack 12 avoid the challenges described above in connection with FIG. 14.

While the circuit pack 12 provides benefits resulting from the slanted edges, there may be other considerations that are addressed by other embodiments described herein. Some challenges may include the following, for example. The total number of ports may be reduced. Here, for example, 12×OSFP connectors are placed and as such the number of ports is reduced by two with respect to a placement such as that of FIG. 14. As such, this limits the number of possible ports.

Figure 16:
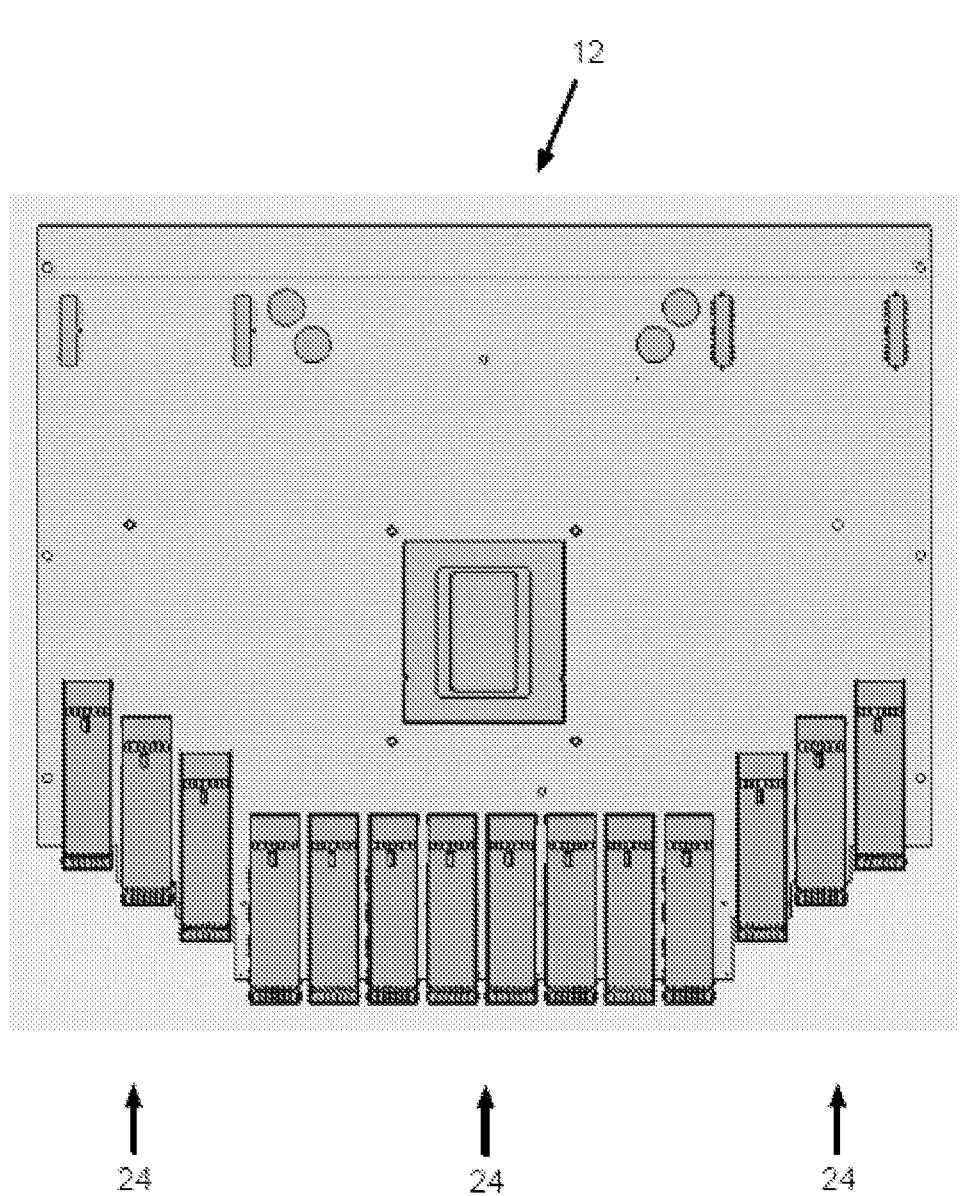
FIG. 16 illustrates a top view of one embodiment of a circuit pack of the present disclosure.

FIG. 16 illustrates a top view of one embodiment of a circuit pack of the present disclosure. Shown is a circuit pack 12 having OSFP ports 24 placed on board with stepped edges. The ports shown are fabric ports 24, in this example, but may also be client ports 22 or a combination thereof. The stepped PCB edges of the circuit pack 12 avoid the challenges described above in connection with FIGS. 14 and 15.

As shown, the ports 24 are stepped but not angled such as the ports 24 of FIGS. 1 to 10. The embodiment of FIG. 16 still provides some benefits over the examples of FIGS. 14 and 15. Furthermore, with any of these example configurations, in various embodiments, LEDs for extreme/distant harder-to-reach ports may be used. LEDs indicate proper connections between a cable and ports. These systems also have exhaust fans on the rear side, where air passes from the front to back. Air inlet direction of extreme ports may also be angled to create air disturbance inside the system with air flowing from front straight inlets. This increases thermal resistance. Populating optical transceivers (with extended heat sink in front) on first and last port increases effective width of the system from standard 19".

To overcome some challenges described herein, embodiments may include stepped ports as shown. The number of optical ports remains same as of a standard straight faceplate, yet the trace lengths of optical extreme ports are reduced (e.g., sub 5 inches, etc.). Also, there is no need to add extra retimer/redriver for extreme port's SerDes lines, thereby saving BOM cost and reducing thermal complexity. SerDes trace routing for extreme ports may also have gaps between adjacent ports, which is good with respect to crosstalk. This also allows for 112G/224G SerDes speeds. LED indication for extreme ports is also straight for better visibility. The air inlet is smooth. There is also improved thermal performance. Also, units with stepped edges may fit into all types of racks where standard units fit. Optical cables may be parallel to all ports whether the ports are straight or stepped. These same concepts may be used with SFP-DD connectors or CFP2-DCO connectors, and any other type of networking ports.

Figure 17:
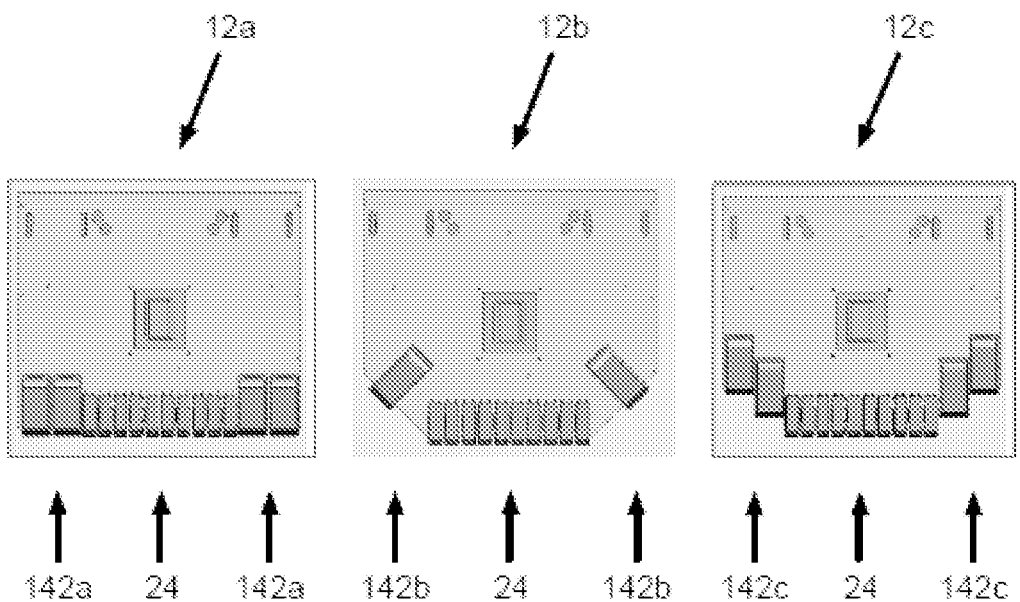
FIG. 17 illustrates top views of embodiments of circuit packs of the present disclosure.

FIG. 17 illustrates top views of embodiments of circuit packs of the present disclosure. Shown are circuit packs 12_a_, 12_b_, and 12_c_, which include ports 24 and connectors 142_a_, 142_b_, and 142_c_. In these particular embodiments, the connectors 142_a_, 142_b_, and 142_c_ are CFP2-DCO, but may be other types of connectors. Also, the ports shown are fabric ports 24 in this example, but may also be client ports 22 or a combination thereof. These example embodiments show a comparison of placements of the connectors 142_a_, 142_b_, and 142_c_. As shown, circuit pack 12_a_ has four connectors 142_a_ that are aligned in a straight line with the ports 24. Circuit pack 12_b_ has two connectors 142_b_ that are angled at 45 degrees relative to the ports 24. Because of the angled configuration of the connectors 142_b_ on the circuit pack 12_b_, there are two connectors 142_b_ compared to the four connectors 142_a_ on the circuit pack 12_a_. Circuit pack 12_c_ has four connectors 142_c_ that are stepped relative to the ports 24. Because there is no angle on the circuit pack 12_c_, there is room for four connectors 142_c_ similar to the four connectors 142_a_ on the circuit pack 12_a_.

Figure 18:
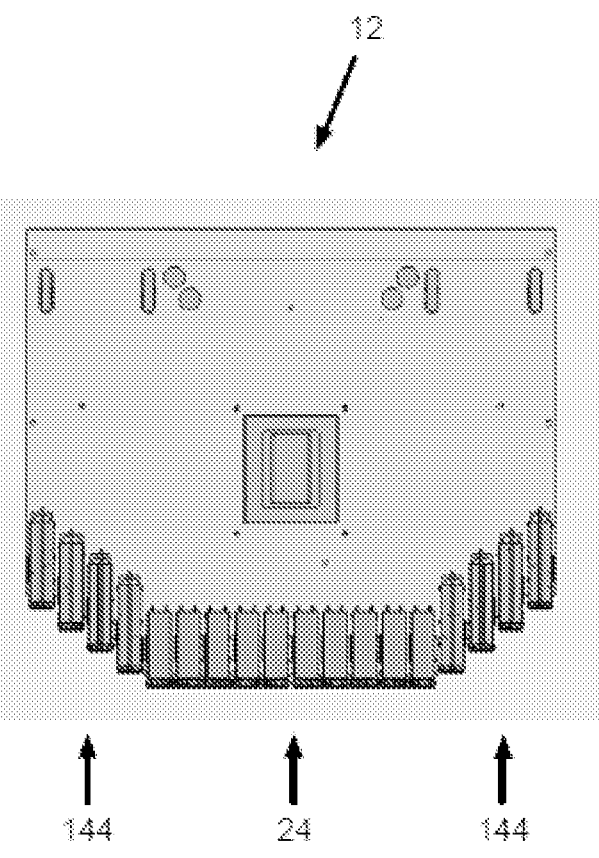
FIG. 18 illustrates a top view of one embodiment of a circuit pack of the present disclosure.

FIG. 18 illustrates a top view of one embodiment of a circuit pack of the present disclosure. Shown is a circuit pack 12 having ports 24 and connectors 144 placed on board with stepped edges. The connectors 144 may be belly-to-belly QSFPDD connectors. The ports shown are fabric ports 24, in this example, but may also be client ports 22 or a combination thereof. This example embodiment shows eight connectors 144 placed in a stepped configuration relative to the ports 24.

Figure 19:
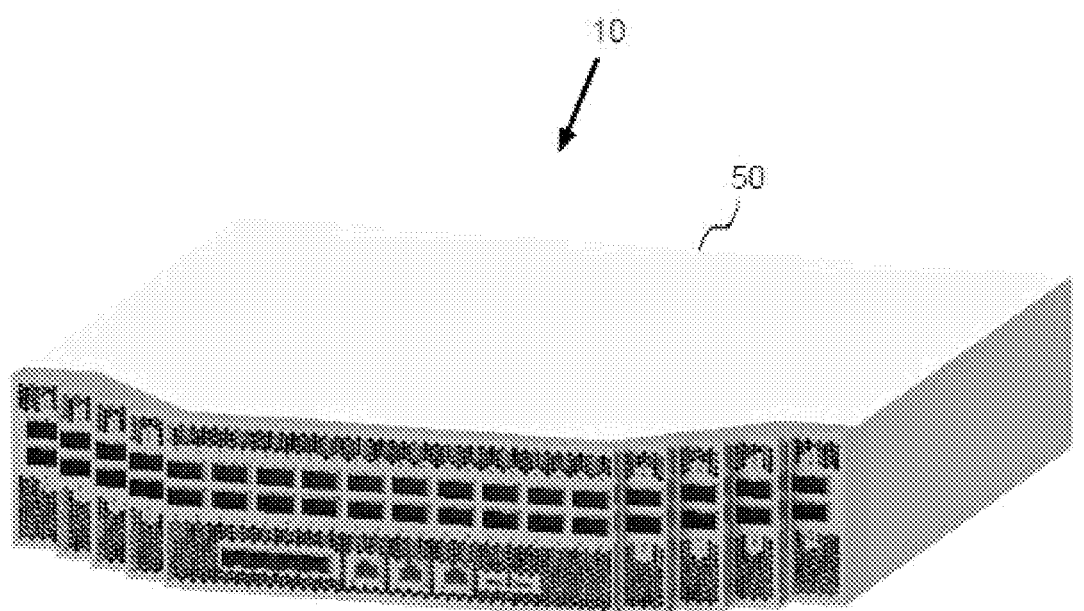
FIG. 19 illustrates a perspective top view of one embodiment of a shelf assembly of the present disclosure.

FIG. 19 illustrates a perspective top view of one embodiment of a shelf assembly of the present disclosure. As shown, the shelf assembly 10 is in a chassis 50. The shelf assembly 10 may be used to house the representative circuit pack 12 of FIG. 18. Further example embodiments directed to the shelf assembly 10 are described in connection with FIG. 20.

Figure 20:
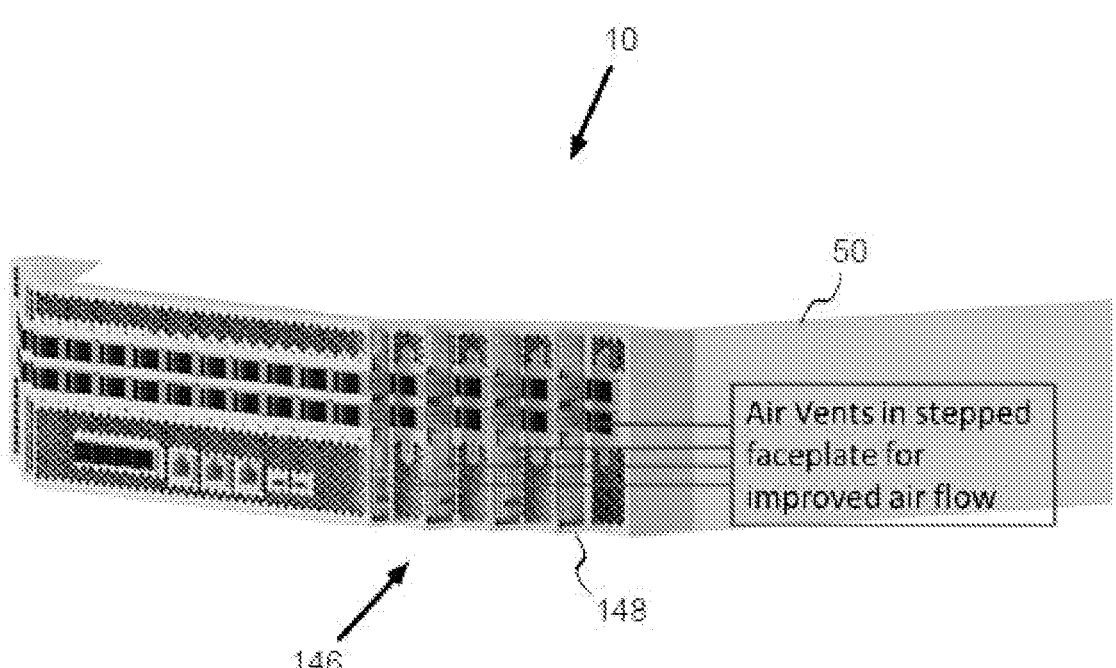
FIG. 20 illustrates a perspective top view of one embodiment of a shelf assembly of the present disclosure.

FIG. 20 illustrates a perspective top view of one embodiment of a shelf assembly of the present disclosure. As shown, the shelf assembly 10 is in a chassis 50. The shelf assembly 10 may be used to house the representative circuit pack 12 of FIG. 18. Shown are air vents 146 configured in a stepped faceplate 148 for improved air flow.

Figure 21:
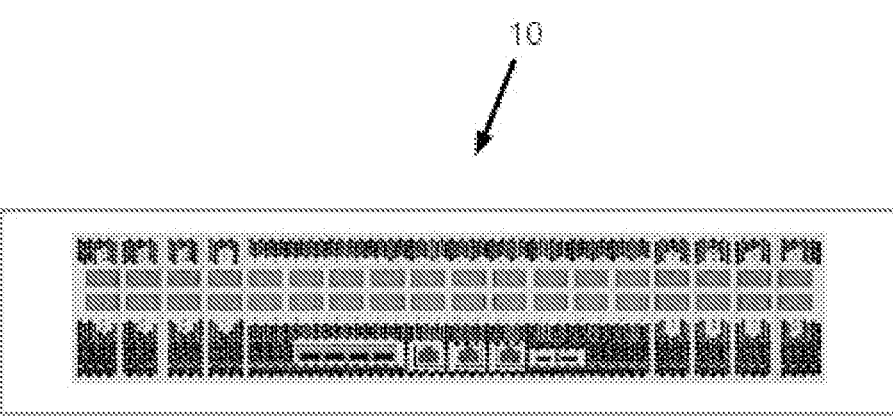
FIG. 21 illustrates a perspective front view of one embodiment of a shelf assembly of the present disclosure.

FIG. 21 illustrates a front view of one embodiment of a shelf assembly of the present disclosure. The shelf assembly 10 may represent the shelf assembly 10 of FIG. 20.

The example embodiments described herein provide reduced trace lengths of optical ports. These reduced trace lengths eliminate the need of adding extra retimer/redriver/flyover cables for extreme port's SerDes lines. This helps in significant BOM cost reduction and reduces or eliminates thermal complexity. As indicated above, SerDes trace routing for extreme ports may have gaps between adjacent ports, which reduces or eliminates crosstalk. The stepped faceplate helps maximize the number of ports on front, which is equal to a flat faceplate. The number of steps on stepped edges may be variable based on design requirements. Similar embodiments may be used with QSFP-DD, CFP2-DCO, and any other type of network port. The placement of LEDs is in front of user, which increases visibility and thus readability. The stepped face plate of some embodiments improves airflow direction from front to back, which in turn improves airflow through heatsink fins. Also, the pressure drop across a stepped faceplate in some embodiments is much less in comparison to a slant edged faceplate. The stepped faceplate may have additional slots on sides for air inlet which helps increase total airflow inside the system. The plugs are easy to insert/remove from the front in comparison to a slant edged faceplate. The optical cable routing is much easier to handle, and insertion of optical cable is much easier in comparison to a slant/flat faceplate, Although the present disclosure is illustrated and described herein with reference to illustrative embodiments and specific examples provided, it will be readily apparent to those of ordinary skill in the art that other embodiments and examples may perform similar functions and/or achieve like results. All such equivalent embodiments and examples are within the spirit and scope of the present disclosure and are intended to be covered by the following non-limiting claims for all purposes.

What is claimed is:

1. A circuit pack adapted to be inserted into a conformal shelf assembly, the circuit pack comprising:
   a printed circuit board disposed in an enclosure comprising a front faceplate and a side facing corner surface adjacent to the front faceplate, wherein the printed circuit board and the enclosure comprise a narrowed front portion and a widened rear portion, wherein side edges of the widened rear portion of the printed circuit board and the enclosure are adapted to be received by guide rails of the shelf assembly;
   an integrated circuit chip coupled to the printed circuit board; and
   a plurality of ports coupled to the printed circuit board and disposed around the integrated circuit chip and a perimeter of the narrowed front portion of the printed circuit board and the enclosure, wherein ports of the plurality of ports are each disposed at the side facing corner surface at a same acute angle relative to towards the front faceplate of the enclosure and stepped relative to each other such that lengths of tracks between the ports and the integrated circuit chip are less than a predetermined maximum length.

2. The circuit pack of claim 1, wherein the acute angle is 45 degrees.

3. The circuit pack of claim 1, wherein the ports of the plurality of ports comprise one or more of client ports and fabric ports.

4. The circuit pack of claim 1, wherein the integrated circuit chip is disposed in a central portion of the printed circuit board and between a plurality of fabric ports and a plurality of client ports of the plurality of ports.

5. The circuit pack of claim 1, further comprising a busbar coupled to the printed circuit board and disposed conformally around at least a portion of a perimeter of the integrated circuit chip.

6. The circuit pack of claim 1, further comprising:
   a heat sink disposed within the enclosure and adjacent to a component side of the printed circuit board, the heat sink configured as a vapor chamber configured to circulate a fluid such that heat is removed from one or more heat sources of the printed circuit board, the vapor chamber comprising:
      an evaporator proximate to the one or more heat sources of the printed circuit board and configured to thermally transfer heat from the one or more heat sources of the printed circuit board to the fluid of the vapor chamber;
      a condenser physically displaced from the one or more heat sources of the printed circuit board and fluidly coupled to the evaporator, the condenser configured to thermally transfer heat from the fluid of the vapor chamber; and
      a wick structure fluidly coupled between the condenser and the evaporator such that the fluid is transferred from the condenser to the evaporator and completing a fluid circuit of the vapor chamber.

7. A shelf assembly adapted to receive an inserted conformal circuit pack, the shelf assembly comprising:
   a chassis defining an opening adapted to provide access to a plurality of ports of the circuit pack, wherein the circuit pack is adapted to be inserted into the shelf assembly, the circuit pack comprising:
   a printed circuit board disposed in an enclosure comprising a front faceplate and a side facing corner surface adjacent to the front faceplate, wherein the printed circuit board and the enclosure comprise a narrowed front portion and a widened rear portion, wherein side edges of the widened rear portion of the printed circuit board and the enclosure are adapted to be received by guide rails of the shelf assembly;
   an integrated circuit chip coupled to the printed circuit board; and
   a plurality of ports coupled to the printed circuit board and disposed around the integrated circuit chip and a perimeter of the narrowed front portion of the printed circuit board and the enclosure, wherein ports of the plurality of ports are each disposed at the side facing corner surface at a same acute angle relative to towards the front faceplate of the enclosure and stepped relative to each other such that lengths of tracks between the ports and the integrated circuit chip are less than a predetermined maximum length.

8. The shelf assembly of claim 7, wherein the acute angle is 45 degrees.

9. The shelf assembly of claim 7, wherein the ports of the plurality of ports comprise one or more of client ports and fabric ports.

10. The shelf assembly of claim 7, wherein the integrated circuit chip is disposed in a central portion of the printed circuit board and between a plurality of fabric ports and a plurality of client ports.

11. The shelf assembly of claim 7, further comprising a busbar coupled to the printed circuit board and disposed conformally around at least a portion of a perimeter of the integrated circuit chip.

12. The shelf assembly of claim 7, further comprising:

a heat sink disposed within the enclosure and adjacent to a component side of the printed circuit board, the heat sink configured as a vapor chamber configured to circulate a fluid such that heat is removed from one or more heat sources of the printed circuit board, the vapor chamber comprising:

an evaporator proximate to the one or more heat sources of the printed circuit board and configured to thermally transfer heat from the one or more heat sources of the printed circuit board to the fluid of the vapor chamber;

a condenser physically displaced from the one or more heat sources of the printed circuit board and fluidly coupled to the evaporator, the condenser configured to thermally transfer heat from the fluid of the vapor chamber; and a wick structure fluidly coupled between the condenser and the evaporator such that the fluid is transferred from the condenser to the evaporator and completing a fluid circuit of the vapor chamber.

13. A shelf system for use in a telecommunications or networking application, the shelf system comprising:

a shelf assembly;

a circuit pack conformally inserted into the shelf assembly, the circuit pack comprising:

a printed circuit board disposed in an enclosure comprising a front faceplate and a side facing corner surface adjacent to the front faceplate, wherein the printed circuit board and the enclosure comprise a narrowed front portion and a widened rear portion, wherein side edges of the widened rear portion of the printed circuit board and the enclosure are adapted to be received by guide rails of the shelf assembly;

an integrated circuit chip coupled to the printed circuit board; and a plurality of ports coupled to the printed circuit board and disposed around the integrated circuit chip and a perimeter of the narrowed front portion of the printed circuit board and the enclosure, wherein ports of the plurality of ports are each disposed at the side facing corner surface at a same acute angle relative to towards the front faceplate of the enclosure and stepped relative to each other such that lengths of tracks between the ports and the integrated circuit chip are less than a predetermined maximum length.

14. The shelf system of claim 13, wherein the acute angle is 45 degrees.

15. The shelf system of claim 13, wherein the ports of the plurality of ports comprise one or more of client ports and fabric ports.

16. The shelf system of claim 13, wherein the integrated circuit chip is disposed in a central portion of the printed circuit board and between a plurality of fabric ports and a plurality of client ports of the plurality of ports.

17. The shelf system of claim 13, further comprising a busbar coupled to the printed circuit board and disposed conformally around at least a portion of a perimeter of the integrated circuit chip.

*     *     *     *     *